(12) United States Patent
Hayakawa et al.

(10) Patent No.: US 9,196,632 B2
(45) Date of Patent: Nov. 24, 2015

(54) SEMICONDUCTOR DEVICE AND METHOD FOR MANUFACTURING THE SAME

(71) Applicant: Semiconductor Energy Laboratory Co., Ltd., Kanagawa-ken (JP)

(72) Inventors: Masahiko Hayakawa, Kanagawa (JP); Mitsunori Sakama, Kabagawa (JP); Satoshi Toriumi, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 14/105,575

(22) Filed: Dec. 13, 2013

(65) Prior Publication Data

US 2014/0139776 A1 May 22, 2014

Related U.S. Application Data

(60) Continuation of application No. 13/440,200, filed on Apr. 5, 2012, now Pat. No. 8,610,182, which is a continuation of application No. 12/910,150, filed on Oct. 22, 2010, now Pat. No. 8,154,059, which is a (Continued)

(30) Foreign Application Priority Data

Mar. 23, 1999 (JP) .................... 11-076992

(51) Int. Cl.
*H01L 29/80* (2006.01)
*H01L 21/31* (2006.01)
(Continued)

(52) U.S. Cl.
CPC .......... *H01L 27/1237* (2013.01); *G02F 1/1368* (2013.01); *H01L 21/3145* (2013.01); *H01L 21/7624* (2013.01); *H01L 27/12* (2013.01);
(Continued)

(58) Field of Classification Search
CPC . H01L 27/12; H01L 27/1214; H01L 27/1237; H01L 21/2026; H01L 21/3145; H01L 21/7624; H01L 29/78621; H01L 29/78603
USPC .................. 438/636, 778, 780, 784, 790, 791; 257/499, 506, 262, 368, 374, E21.293
See application file for complete search history.

(56) References Cited

U.S. PATENT DOCUMENTS

| 5,108,843 A | 4/1992 | Ohtaka et al. |
| 5,247,190 A | 9/1993 | Friend et al. |

(Continued)

FOREIGN PATENT DOCUMENTS

| JP | 5-152331 | 6/1993 |
| JP | 5-275702 | 10/1993 |

(Continued)

OTHER PUBLICATIONS

Yeh, J.-L. et al., "Structural and Optical Properties of Amorphous Silicon Oxynitride," Journal of Applied Physics, vol. 9, No. 2, Jan. 15, 1996, pp. 656-663.

(Continued)

*Primary Examiner* — Hsien Ming Lee
(74) *Attorney, Agent, or Firm* — Husch Blackwell LLP

(57) ABSTRACT

An object of the present invention is to prevent the deterioration of a TFT (thin film transistor). The deterioration of the TFT by a BT test is prevented by forming a silicon oxide nitride film between the semiconductor layer of the TFT and a substrate, wherein the silicon oxide nitride film ranges from 0.3 to 1.6 in a ratio of the concentration of N to the concentration of Si.

24 Claims, 15 Drawing Sheets

Related U.S. Application Data continuation of application No. 12/399,573, filed on Mar. 6, 2009, now Pat. No. 7,821,071, which is a continuation of application No. 11/418,717, filed on May 5, 2006, now Pat. No. 7,504,343, which is a continuation of application No. 11/025,344, filed on Dec. 28, 2004, now Pat. No. 7,064,388, which is a division of application No. 09/532,915, filed on Mar. 22, 2000, now Pat. No. 6,858,898.

(51) Int. Cl.
| | |
|---|---|
| H01L 27/12 | (2006.01) |
| H01L 21/314 | (2006.01) |
| H01L 21/762 | (2006.01) |
| H01L 29/786 | (2006.01) |
| G02F 1/1368 | (2006.01) |
| H01L 21/20 | (2006.01) |

(52) U.S. Cl.
CPC ...... *H01L 27/1248* (2013.01); *H01L 29/78603* (2013.01); *H01L 29/78621* (2013.01); *H01L 21/2026* (2013.01)

(56) References Cited

U.S. PATENT DOCUMENTS

| | | |
|---|---|---|
| 5,254,208 A | 10/1993 | Zhang |
| 5,273,920 A | 12/1993 | Kwasnick et al. |
| 5,298,455 A | 3/1994 | Arai et al. |
| 5,306,651 A | 4/1994 | Masumo et al. |
| 5,323,042 A | 6/1994 | Matsumoto |
| 5,399,502 A | 3/1995 | Friend et al. |
| 5,504,020 A | 4/1996 | Aomori et al. |
| 5,508,532 A | 4/1996 | Teramoto |
| 5,594,569 A | 1/1997 | Konuma et al. |
| 5,640,067 A | 6/1997 | Yamauchi et al. |
| 5,643,826 A | 7/1997 | Ohtani et al. |
| 5,707,746 A | 1/1998 | Yaoi et al. |
| 5,731,613 A | 3/1998 | Yamazaki et al. |
| 5,747,830 A | 5/1998 | Okita |
| 5,771,110 A | 6/1998 | Hirano et al. |
| 5,773,325 A | 6/1998 | Teramoto |
| 5,815,223 A | 9/1998 | Watanabe et al. |
| 5,858,823 A | 1/1999 | Yamazaki et al. |
| 5,893,730 A | 4/1999 | Yamazaki et al. |
| 5,897,328 A | 4/1999 | Yamauchi et al. |
| 5,923,962 A | 7/1999 | Ohtani et al. |
| 5,949,107 A | 9/1999 | Zhang |
| 5,970,384 A | 10/1999 | Yamazaki et al. |
| 6,048,758 A | 4/2000 | Yamazaki et al. |
| 6,087,229 A | 7/2000 | Aronowitz et al. |
| 6,093,577 A | 7/2000 | Van Der Groen et al. |
| 6,157,426 A | 12/2000 | Gu |
| 6,165,695 A | 12/2000 | Yang et al. |
| 6,165,824 A | 12/2000 | Takano et al. |
| 6,166,414 A | 12/2000 | Miyazaki et al. |
| 6,174,590 B1 | 1/2001 | Iyer et al. |
| 6,198,133 B1 | 3/2001 | Yamazaki et al. |
| 6,215,163 B1 | 4/2001 | Hori et al. |
| 6,225,645 B1 | 5/2001 | Zhang |
| 6,271,897 B1 | 8/2001 | Ichikawa et al. |
| 6,274,516 B1 | 8/2001 | Kamei et al. |
| 6,281,552 B1 | 8/2001 | Kawasaki et al. |
| 6,285,042 B1 | 9/2001 | Ohtani et al. |
| 6,300,253 B1 | 10/2001 | Moore et al. |
| 6,306,694 B1 | 10/2001 | Yamazaki et al. |
| 6,316,810 B1 | 11/2001 | Yamazaki et al. |
| 6,335,541 B1 | 1/2002 | Ohtani et al. |
| 6,365,933 B1 | 4/2002 | Yamazaki et al. |
| 6,380,558 B1 | 4/2002 | Yamazaki et al. |
| 6,399,988 B1 | 6/2002 | Yamazaki |
| 6,420,282 B1 | 7/2002 | Batey et al. |
| 6,429,483 B1 | 8/2002 | Teramoto |
| 6,461,899 B1 | 10/2002 | Kitakado et al. |
| 6,478,263 B1 | 11/2002 | Yamazaki et al. |
| 6,507,069 B1 | 1/2003 | Zhang et al. |
| 6,524,895 B2 | 2/2003 | Yamazaki et al. |
| 6,531,713 B1 | 3/2003 | Yamazaki |
| 6,534,826 B2 | 3/2003 | Yamazaki |
| 6,580,094 B1 | 6/2003 | Yamazaki et al. |
| 6,614,052 B1 | 9/2003 | Zhang |
| 6,645,826 B2 | 11/2003 | Yamazaki et al. |
| 6,773,971 B1 | 8/2004 | Zhang et al. |
| 6,809,343 B2 | 10/2004 | Yamazaki et al. |
| 6,815,271 B2 | 11/2004 | Zhang |
| 6,906,383 B1 | 6/2005 | Zhang et al. |
| 7,183,614 B2 | 2/2007 | Zhang et al. |
| 7,279,752 B2 | 10/2007 | Yamazaki et al. |
| 7,352,003 B2 | 4/2008 | Zhang |
| 7,635,895 B2 | 12/2009 | Zhang et al. |
| 7,821,071 B2 | 10/2010 | Hayakawa et al. |
| 2001/0004121 A1 | 6/2001 | Sakama et al. |
| 2001/0046791 A1 | 11/2001 | Subramanian et al. |
| 2003/0100150 A1 | 5/2003 | Kitakado et al. |
| 2004/0079952 A1 | 4/2004 | Yamazaki et al. |
| 2008/0029765 A1 | 2/2008 | Yamazaki et al. |
| 2012/0187411 A1 | 7/2012 | Hayakawa et al. |

FOREIGN PATENT DOCUMENTS

| | | |
|---|---|---|
| JP | 6-260499 | 9/1994 |
| JP | 7-130652 | 5/1995 |
| JP | 7-335900 | 12/1995 |
| JP | 8-32080 | 2/1996 |
| JP | 8-64834 | 3/1996 |
| JP | 8-78329 | 3/1996 |
| JP | 9-17729 | 1/1997 |
| JP | 9-162405 | 6/1997 |
| JP | 9-191111 | 7/1997 |
| JP | 10-92576 | 4/1998 |
| JP | 10-135468 | 5/1998 |
| JP | 10-135469 | 5/1998 |
| JP | 10-247735 | 9/1998 |
| JP | 11-223839 | 8/1999 |
| JP | 2000-269506 | 9/2000 |
| JP | 2001-135824 | 5/2001 |
| WO | WO 90/13148 A1 | 11/1990 |
| WO | WO 99/10918 A1 | 3/1999 |

OTHER PUBLICATIONS

Yoshida, T. et al., "33.2: A Full-Color Thresholdless Antiferroelectric LCD Exhibiting Wide Viewing Angle with Fast Response Time," SID Digest '97: SID International Symposium Digest of Technical Papers, 1997, pp. 841-844.

Furue, H. et al., "P-78: Characteristics and Driving Scheme of Polymer-Stabilized Monostable FLCD Exhibiting Fast Response Time and High Contrast Ratio with Gary-Scale Capability," SID Digest '98: SID International Symposium Digest of Technical Papers, 1998, pp. 782-785.

Inui, S. et al., "Thresholdless Antiferroelectricity in Liquid Crystals and its Application to Displays," Journal of Materials Chemistry, vol. 6, No. 4, 1996, pp. 671-673.

Yoshihara, T., "Time Division Full Color LCD by Ferroelectric Liquid Crystal," EKISHO, vol. 3, No. 3, Jul. 25, 1999, pp. 190-194.

Schenk, H. et al., "Polymers for Light Emitting Diodes," Eurodisplay '99: Proceedings of the 19th IDRC (International Display Research Conference Proceedings), Sep. 6, 1999, pp. 33-37.

Terada, M. et al., "Half-V Shaped Switching Mode FLCD," Proceedings of 46th Applied Physics Association Lectures, vol. 28p-V-8, Mar. 1, 1999, p. 1316.

FORMATION OF INSULATING LAYER 101a

SEQUENTIAL FORMATION OF INSULATING LAYER 101b
AND SEMICONDUCTOR FILM

CRYSTALLIZATION

FORMATION OF ACTIVE LAYER AND GATE INSULATING FILM

FORMATION OF GATE WIRING

ANODIC OXIDATION

DOPING WITH PHOSPHORUS

DOPING WITH BORON

FORMATION OF WIRING

P-CHANNEL TYPE        N-CHANNEL TYPE

FIG.3

| | SUBSTRATE 1 | SUBSTRATE 2 | SUBSTRATE 3 | SUBSTRATE 4 |
|---|---|---|---|---|
| FLOW RATE OF RAW MATERIAL GAS | SiH4 | 4 | 10 | 15 |
| | N2O | 400 | 20 | 20 |
| | NH3 | 0 | 100 | 200 |
| HEAT TREATMENT | | CONDUCTED | NO | NO | NO |
| COMPOSITION RATIO (ATOMIC %) | N | 7.0 | 24.0 | 44.1 |
| | O | 59.5 | 26.5 | 6.0 |
| | Si | 32.0 | 33.0 | 34.4 |
| | H | 1.5 | 16.5 | 15.5 |
| REFRACTIVE INDEX | | 1.4566 | 1.7468 | 1.7975 |

FILM FORMING CONDITIONS AND PHYSICAL PROPERTIES OF INSULATING LAYER (SILICON OXIDE NITRIDE LAYER) 101a

◨ N-CHANNEL TYPE (L/W=5.6/7.5 μm)
◪ P-CHANNEL TYPE (L/W=5.6/7.5 μm)

VARIATION OF VG ID MIN (V)

CHANGE OF NUMBER OF DIGITS OF I CUT
※ STRESS CONDITIONS
150°C, 1 HOUR, VG : 20V (N-CHANNEL TYPE); -20V (P-CHANNEL TYPE), VD=VS=0V

ID-VG CHARACTERISTIC CURVE

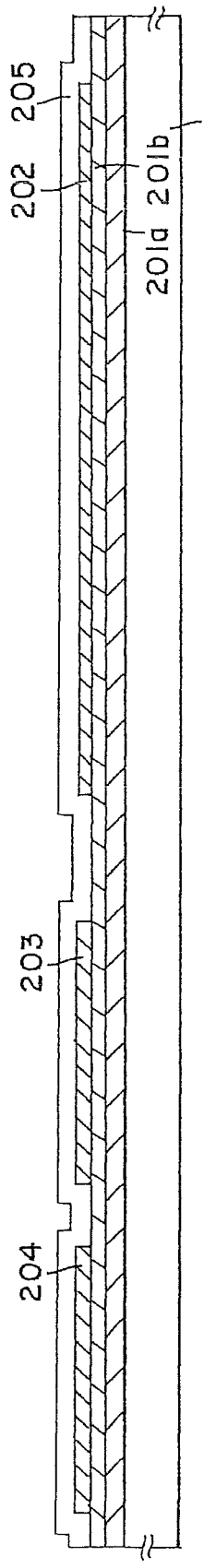
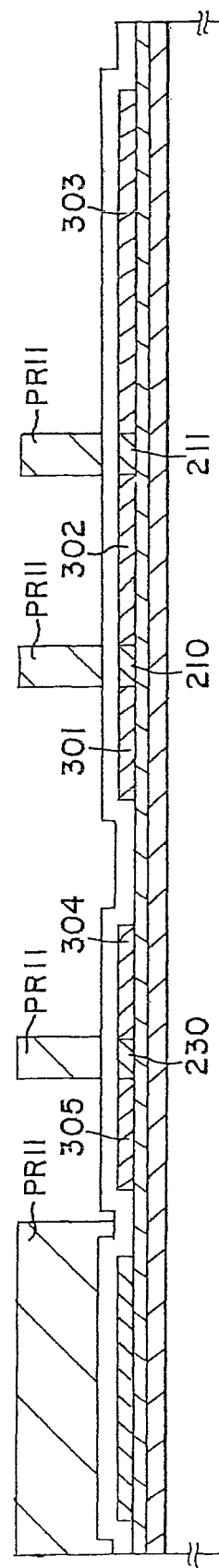
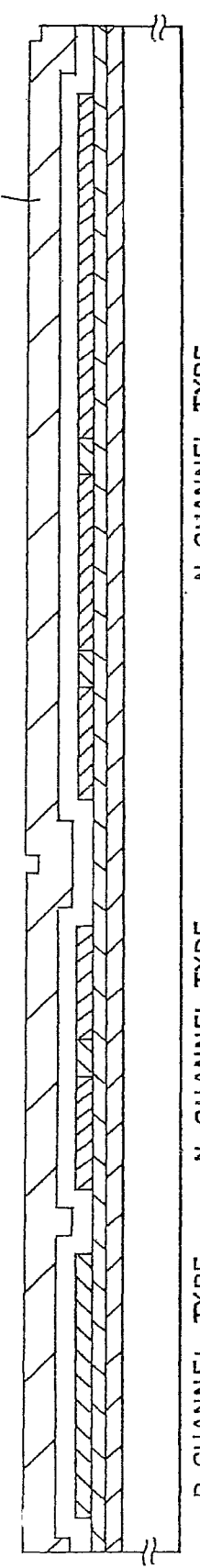
FIG. 7(A) FORMATION OF UNDERLYING FILM, ACTIVE LAYER AND GATE INSULATING FILM
FIG. 7(B) DOPING PROCESS OF PHOSPHORUS (FORMATION OF n⁻-TYPE REGION)
FIG. 7(C) FORMATION OF CONDUCTIVE FILM

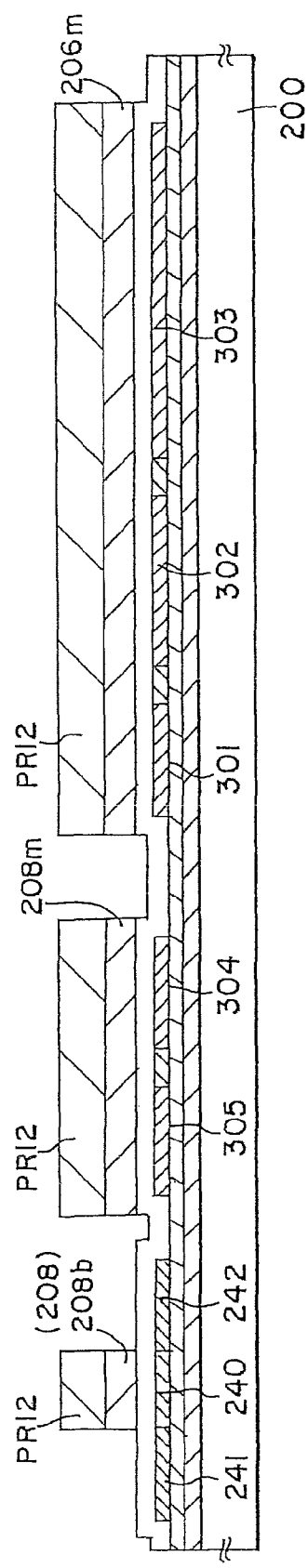
FIG. 8(A) DOPING WITH BORON (FORMATION OF P+-TYPE REGION)
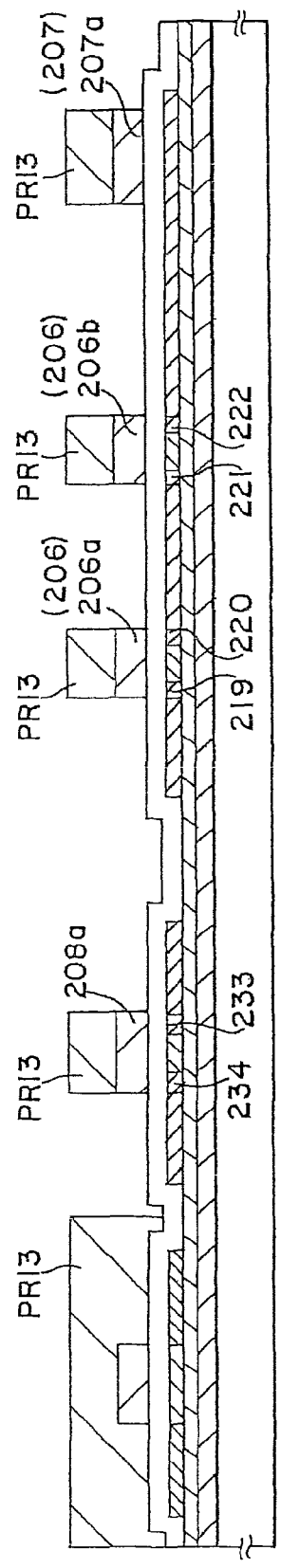
FIG. 8(B) FORMATION OF WIRING
P-CHANNEL TYPE   N-CHANNEL TYPE   N-CHANNEL TYPE

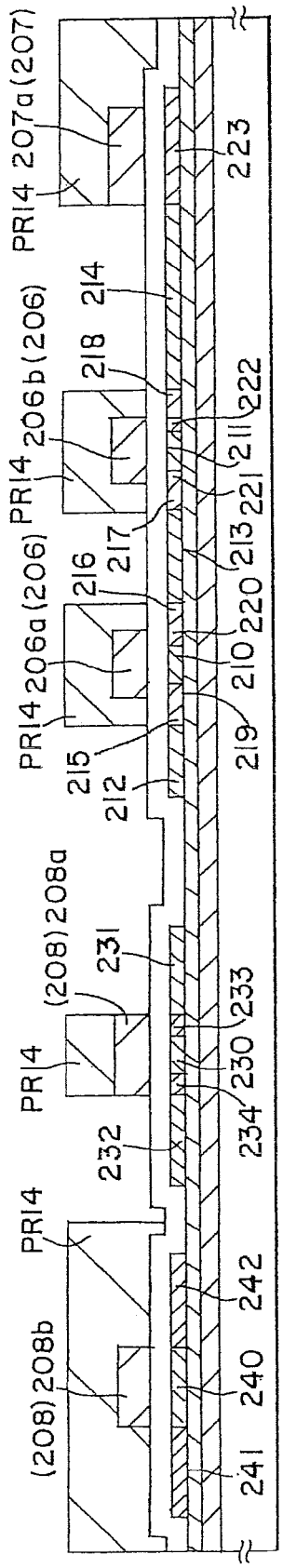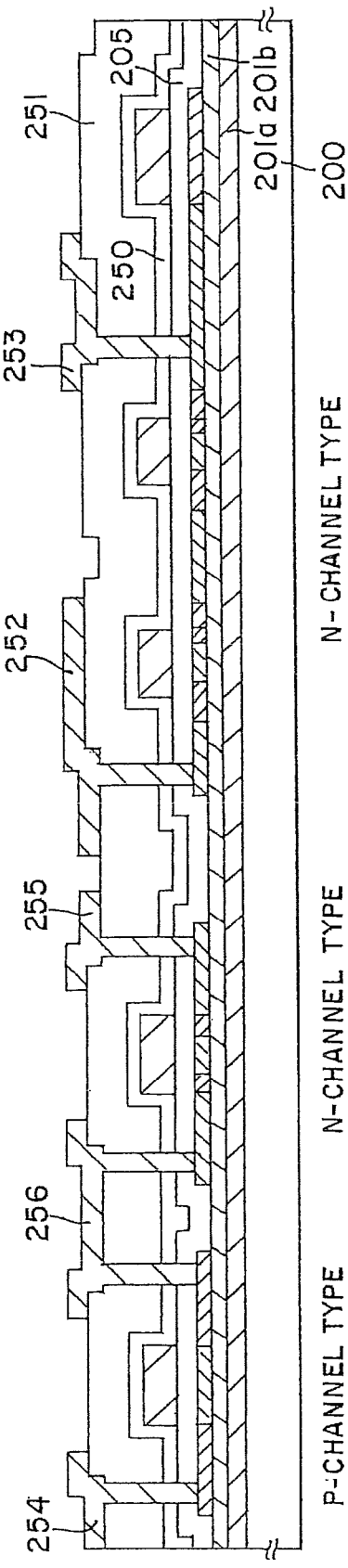

PLAN VIEW OF PIXEL MATRIX CIRCUIT

FIG. 15(A)
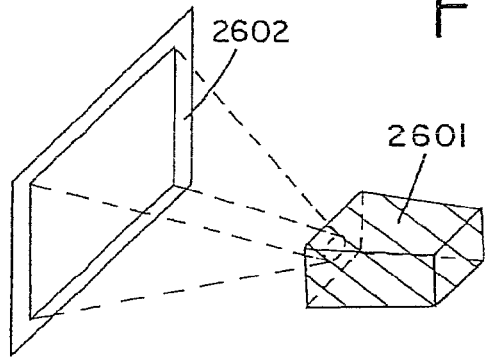
FIG. 15(B)
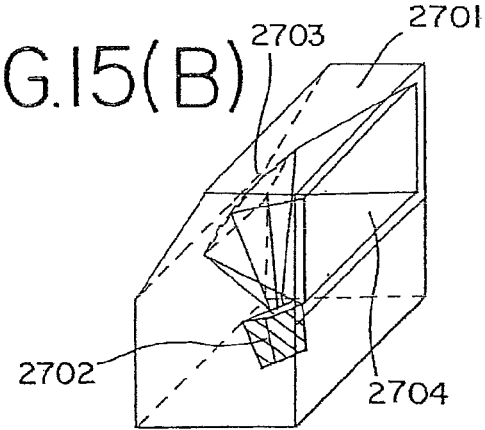
FIG. 15(C) PROJECTION UNIT (THREE-LENS TYPE)
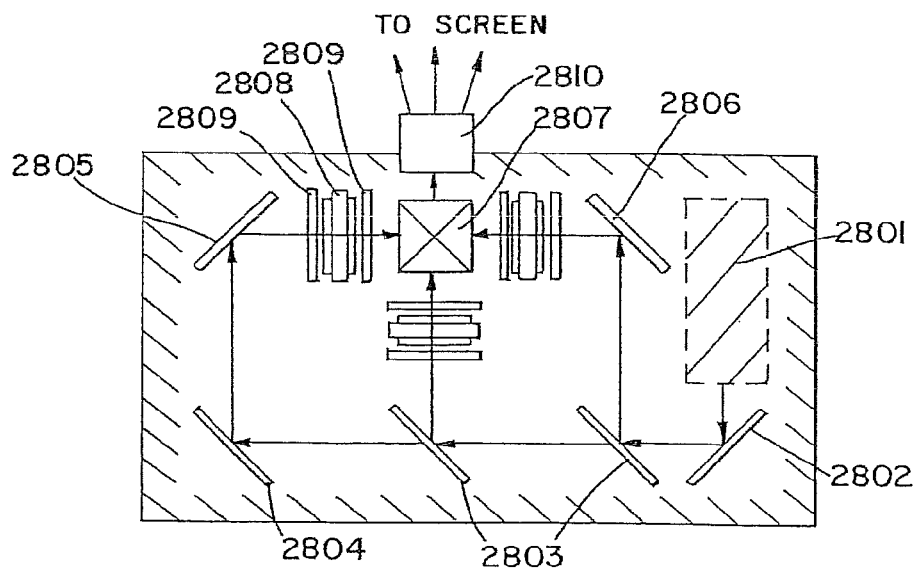
FIG. 15(D) LIGHT SOURCE OPTICAL SYSTEM
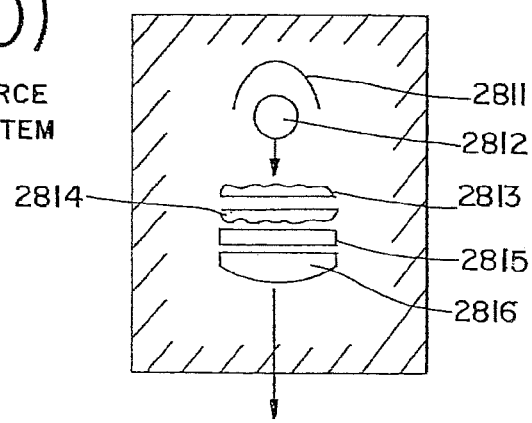

SEMICONDUCTOR DEVICE AND METHOD FOR MANUFACTURING THE SAME

This application is a continuation of U.S. application Ser. No. 13/440,200, filed on Apr. 5, 2012 which is a continuation of U.S. application Ser. No. 12/910,150, filed on Oct. 22, 2010 (now U.S. Pat. No. 8,154,059 issued Apr. 10, 2012) which is a continuation of U.S. application Ser. No. 12/399,573, filed on Mar. 6, 2009 (now U.S. Pat. No. 7,821,071 issued Oct. 26, 2010) which is a continuation of U.S. application Ser. No. 11/418,717, filed on May 5, 2006 (now U.S. Pat. No. 7,504,343 issued Mar. 17, 2009) which is a continuation of U.S. application Ser. No. 11/025,344, filed on Dec. 28, 2004 (now U.S. Pat. No. 7,064,388 issued Jun. 20, 2006) which is a divisional of U.S. application Ser. No. 09/532,915, filed on Mar. 22, 2000 (now U.S. Pat. No. 6,858,898 issued Feb. 22, 2005), all of which are incorporated herein by reference.

BACKGROUND OF THE INVENTION

1. Field of the Invention

The present invention relates to a semiconductor device having a circuit including a thin film transistor and a method for manufacturing the same, and more particularly, to an insulating film for separating a substrate from the active layer of the thin film transistor.

This kind of insulating film includes an underlying film formed on the whole surface of a substrate and a gate insulating film of a thin film transistor of a bottom gate type (typically, an inverted stagger type). The present invention relates to an underlying film or a gate insulating film suitable for preventing the deterioration of a thin film transistor.

A semiconductor device in accordance with the present invention includes not only such a device as a thin film transistor (TFT) or a MOS transistor but also an electro-optical device such as a display device and an image sensor which have a semiconductor circuit constituted by these insulating gate type transistors. Further, the semiconductor device in accordance with the present invention includes an electronic device provided with these display device and electro-optical device.

2. Description of the Related Art

In recent years, because of the increasing need for the upsizing and the falling costs of a liquid crystal display, the liquid crystal display has been expanding its market instead of a CRT, in particular, in the field of an OA product.

A pixel matrix circuit and a driver circuit can be made on the same substrate by making a thin film transistor (TFT) used in the liquid crystal display of polycrystalline silicon. Further, the fine patterning of the polycrystalline silicon has enabled a high aperture ratio and a high definition display.

In order to realize the further lower price of the liquid crystal display, it is required to use a glass substrate as a substrate. Accordingly, a research on a technology for manufacturing a TFT at a process temperature of from 600° C. to 700° C. or less has been carried out.

Since the glass substrate contains a lot of impurity ions such as Na$^+$ or the like, it is necessary to form an underlying film made of silicon oxide, silicon nitride, or the like on the surface of the glass substrate to prevent the impurity ions from entering a semiconductor film.

When voltage is impressed by gate electrodes, an electric field is generated in an active layer, whereby the impurity ions in the substrate are attracted to the active layer. When the impurity ions enter the gate insulating film or the active layer through the underlying film or the gate insulating film, they vary electric characteristics, which results in incapability of guaranteeing reliability which does not vary with time.

In particular, in the case of a top gate type TFT, a region where a channel is formed is in contact with the underlying film and hence the quality of the underlying film has a profound effect on the characteristics of the TFT.

In a process for manufacturing a liquid crystal panel, a plasma CVD method is usually used for forming an underlying film or a gate insulating film. This is because the plasma CVD is performed at a low process temperature of from 300° C. to 400° C. and has a large throughput and can form a film in a large area.

Also, a silicon nitride ($SiN_x$) or a silicon oxide ($SiO_x$) is usually used as the underlying film. It is well known that the silicon nitride ($SiN_x$) has the high effect of blocking impurity ions but has many trap levels, which present a problem in the characteristics of the TFT. The silicon oxide ($SiO_x$) has advantages in that it has a wider band gap, better insulation, and lower trap level than the silicon nitride. However, it tends to absorb moisture and has the low effect of blocking the impurity ions.

Also, many films are laminated in the process for manufacturing a liquid crystal panel to manufacture a TFT, and the interaction of the internal stresses which is generated by the difference in the internal stresses between the films presents problems of varying the electric characteristics of the TFT such as a threshold, in some cases, warping the substrate, and separating the film.

The glass substrate is subjected to a heating treatment at a temperature close to its distortion point where amorphous silicon is crystallized and the glass substrate is shrunk by the heating treatment. Therefore, it is thought to be desirable that the internal stress generated in the insulating film formed on the glass substrate is a tensile stress to relieve the internal stress.

SUMMARY OF THE INVENTION

It is an object of the present invention to provide an insulating film capable of blocking impurities from a substrate and eliminating the problems caused by an internal stress and to improve the reliability of a TFT.

In order to solve the above-mentioned problems, according to the present invention, an insulating film including at least a silicon oxide nitride ($SiO_xN_y$) layer is formed on a substrate as an insulating film separating the substrate from a semiconductor film constituting an active layer.

The silicon oxide nitride layer formed improves the blocking effect of the insulating film and relieves the effect caused by the shrinkage of the substrate to improve resistance to a thermal stress.

To this end, a silicon oxide film is made a silicon oxide nitride film having a tensile stress in an asdepo state and after a heating treatment by increasing the content of nitrogen of the silicon oxide film to realize the blocking of impurities and the prevention of water absorption and to compensate the shrinkage of the substrate.

The inventor found that, to provide the silicon oxide nitride film with the characteristics like this, the composition of the silicon oxide nitride film is required to be in a suitable range; that is, a ratio of the concentration of N to the concentration of Si of the silicon oxide nitride film, namely, a ratio of composition of N/Si is from 0.3 to 1.6, more preferably, from 0.6 to 1.4.

As is the case with a ratio of composition of N/Si, a ratio of composition of O/Si is required to be in a suitable range; that is, a ratio of the concentration of O to the concentration of Si of the silicon oxide nitride layer, namely, a ratio of composition of O/Si is from 0.1 to 1.7, more preferably, from 0.2 to 1.0.

Also, in the case where the silicon oxide nitride layer is formed by a CVD method, the composition contains not only Si, O, and N but also H contained by a raw material gas. There is a refractive index as a physical property reflecting the concentration of H as well as the concentrations of N and O. According to the present invention, it is preferable that a ratio of the concentration of N to the concentration of Si of the silicon oxide nitride film is in the above-mentioned range and that a refractive index to a wavelength of 632.8 nm ranges from 1.5 to 1.8, more preferably, from 1.7 to 1.8.

The silicon oxide nitride film has the following tendencies: as the composition ratio of N of the film increases, the density of the film increases and a refractive index increases; and as the content of H increases, the density of the film decreases and the refractive index decreases. For this reason, the refractive index is in the above-mentioned range from a balance of a ratio of the composition (concentration) of N to the composition (concentration) of H.

It is recommended that a CVD method such as a plasma CVD, a low pressure CVD, an ECR CVD be used for forming a silicon oxide nitride layer in accordance with the present invention. $SiH_4$, $N_2O$, and $NH_3$ are used as raw material gases. $Si_2H_6$ (disilane) may be used as a source of Si instead of the $SiH_4$ (monosilane). The $NH_3$ (ammonia) complements the effect of nitrification of $N_2O$ (nitrous oxide) and the addition of $NH_3$ can increase the concentration of nitrogen of the silicon oxide nitride layer. $N_2$ can be used instead of the $NH_3$. Also, $N_2O$ is a source of O. $O_2$, or $O_3$ can be used as a source of O. The ratio of the compositions (concentrations) of Si, O, N, and H can be controlled by adjusting the rate of flow of the raw material gas, a substrate temperature, pressure, RF power, and a gap between electrodes.

Further, in the present invention, in order to enhance the effect of blocking impurities, it is preferable that the silicon oxide nitride layer is formed in contact with the surface of the substrate.

Since the silicon oxide nitride layer in accordance with the present invention is comparatively high in the concentration of nitrogen, it has more fixed charges and is lower in an insulating property as compared with a silicon oxide layer. Therefore, if an active layer is formed directly on the surface of the silicon oxide nitride layer, a trap level tends to be formed at an interface between the silicon oxide nitride layer and the active layer.

Therefore, according to the present invention, in order to prevent the formation of the trap level and to enhance a dielectric property, there are formed at least a silicon oxide nitride layer and an insulating layer which contains Si and O and is lower in the concentration of nitrogen than the silicon oxide nitride layer.

In this constitution, it is preferable that the silicon oxide nitride layer is formed in contact with the surface of the substrate and that an insulating layer containing Si and O is formed between the silicon oxide nitride layer and the active layer. It is preferable that when the active layer is formed in contact with the surface of the insulating film layer containing Si and O, a semiconductor film constituting the active layer is sequentially formed so as not to expose the surface of the insulating layer containing Si and O to the atmosphere. This can prevent the contamination of an interface between the insulating layer and the active layer, which is preferable to control the characteristics of the TFT.

Examples of the insulating layer containing Si and O include a silicon oxide layer and an silicon oxide nitride layer.

It is recommended that a CVD method such as a plasma CVD, a low pressure CVD, an ECR CVD be used for forming these layers. Organic silane such as TEOS or the like is used as a raw material gas as a source of Si, and $O_2$ or $O_3$ is used as a source of O. Also, inorganic silane such as $SiH_4$ (monosilane) or $Si_2H_6$ (disilane) can be used as a source of Si, and $O_2$, $O_3$, or $N_2O$ can be used as a source of O.

If a gas containing oxygen and nitrogen, for example, $N_2O$, is used as a source of oxygen, the insulating layer contains not only Si and O but also N, and it is recommended that a ratio of the concentration of N to the concentration of Si (a ratio of composition of N/Si) ranges from 0.1 to 0.8; specifically, the concentration of nitrogen is $2 \times 10^{20}$ atoms/cm$^3$ or less. The ratio of the composition of the insulating film containing Si and O can be controlled by adjusting the kinds of the raw material gases, the rate of flow of them, a substrate temperature, pressure, RF power, and a gap between electrodes.

In the present invention, a semiconductor film formed as a film constituting an active layer is a non-single crystal semiconductor film, that is, an amorphous semiconductor film, an amorphous semiconductor film having fine crystals, or a crystalline semiconductor film. The crystalline semiconductor film means a microcrystalline semiconductor film and a polycrystalline semiconductor film. A silicon semiconductor, a germanium semiconductor, silicon germanium semiconductor, and a compound semiconductor can be used as the semiconductor. Also, in the case where the amorphous semiconductor film, the amorphous semiconductor film having microcrystals, or the microcrystalline semiconductor film is formed, it is desirable to enhance the crystallization of the film by a heat treatment or a laser irradiation to use as the active layer.

Also, a glass substrate, a plastic substrate made of such as PET or the like, a quartz substrate, a crystalline glass (ceramic) substrate is used as an insulating substrate.

BRIEF DESCRIPTION OF THE DRAWINGS

FIG. 3 is a table showing the film forming conditions and physical properties of an insulating layer 101a;

FIG. 7(A) to FIG. 7(C) is a cross-sectional view of a process for manufacturing an active matrix substrate;

FIG. 8(A) and FIG. 8(B) is a cross-sectional view of a process for manufacturing an active matrix substrate;

FIG. 9(A) and FIG. 9(B) is a cross-sectional view of a process for manufacturing an active matrix substrate;

FIG. 15(A) to FIG. 15(D) shows illustrations of a projector type display units; and FIG. 16(A) to FIG. 16(C) shows illustrations of electronic products.

DESCRIPTION OF THE PREFERRED EMBODIMENTS

The preferred embodiments in accordance with the present invention will be described with reference to FIGS. 1 to 5.

Preferred Embodiment 1

In the present preferred embodiment, a manufacturing process of a CMOS circuit including an n-channel-type TFT and a p-channel-type TFT will be described. A preferred embodiment will be described in which an insulating film in accordance with the present invention is used for a top-gate-type underlying film. Also, a process to the present invention will be described.

A manufacturing process of the present prefered embodiment will be described below with reference to FIG. 1 and FIG. 2. Also, in the present preferred embodiment, four conditions were set and the composition of the underlying film suitable for preventing the deterioration of a TFT was investigated.

(Process for Forming an Underlying Film/a Semiconductor)

A 5-inch 1737 glass substrate (made by Corning Corp.) was used as a glass substrate 100. An underlying film 101 was formed in contact with the whole surface of the glass substrate 100. The underlying film 101 was made of a laminated film of insulating layers 101a and 101b. In the present preferred embodiment, four different conditions were set to investigate variations in the characteristics of a TFT which were caused by the film forming conditions of the insulating layer 101a and the presence or absence of a heat treatment process of the insulating layer 101a. Here, substrates subjected to different conditions are distinguished from each other like a substrate-1, a substrate-2. FIG. 3 shows the raw material gas and its rate of flow of the insulating layers 101a and 101b, and the presence or absence of a heat treatment to the insulating layer 101a.

Figure 1A:
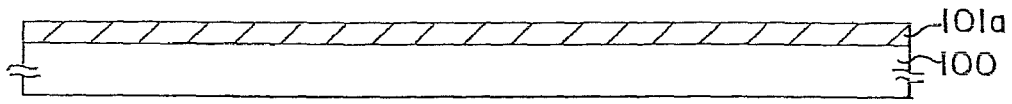
FIG. 1(A) to FIG. 1(E) is a cross-sectional view showing a process for manufacturing a CMOS circuit.

[Forming of an Insulating Layer 101a] See FIG. 1(A).

The insulating layer 101a made of silicon oxide nitride was formed in contact with the glass substrate 100 by a plasma CVD method.

On each of a substrate-1 and a substrate-2 was formed a silicon oxide nitride film using $SiH_4$ and $N_2O$ as raw material gases, respectively. On each of a substrate-3 and a substrate-4 was formed a silicon oxide nitride film using $SiH_4$, $N_2O$, and $NH_3$ as the raw material gases, respectively. The rate of flow of each raw material gas will be shown in Table 1. The other conditions were common to the substrates 1 to 4: that is, a substrate temperature was 400° C., pressure was 0.3 Torr, and RF power was 300 W. Also, the thickness of the insulating layer 101a of each substrate was 200 nm.

The ratio of composition and the refractive index of the insulating layer 101a made of silicon oxide nitride of the substrate-1 to the substrate-4 will be shown in FIG. 3. The ratio of composition was measured by an RBS (Rutherford backscattering spectrometry) method.

[Heat Treatment of the Insulating Layer 101a]

Only the insulating layer 101a of the substrate-1 was heated at 640° C. and then was cooled for four hours.

Following processes were common to the substrate-1 to the substrate-4.

Figure 1B:
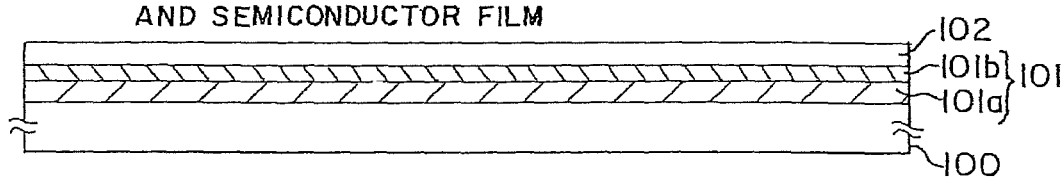

(Sequential Forming of an Insulating Layer 101b and an Amorphous Silicon Film) See FIG. 1(B).

An insulating layer 101b made of a silicon oxide film was formed in contact with the surface of the insulating layer 101a. An amorphous silicon film 102 was formed on the insulating layer 101b without exposing the surface of the insulating layer 101b to the atmosphere. A multi-chamber-type plasma CVD apparatus provided with a chamber for forming the insulating layer 101b and a chamber for forming the amorphous silicon film 102 was used as a film forming apparatus.

The raw material gases of the insulating layer 101b were TEOS (rate of flow: 10 sccm) and $O_2$ (rate of flow: 50 sccm), and when the insulating layer 101b was formed, a substrate temperature was 400° C., pressure was 0.3 Torr, and RF power was 300 W. Also, the silicon oxide film was formed in a thickness of 15 nm.

The raw material gases of the amorphous silicon film 102 were $SiH_4$ (rate of flow: 100 sccm) and the amorphous silicon film 102 was formed in a thickness of 55 nm. When the amorphous silicon film 102 was formed, a substrate temperature was 300° C., pressure was 0.5 Torr, and RF power was 20 W.

Figure 1C:
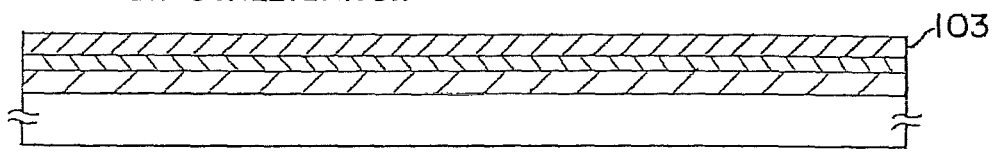
Figure 1D:
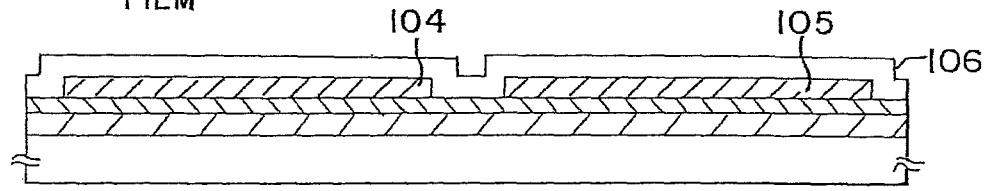

(Crystallization of an Amorphous Silicon Film) See FIG. 1(C).

A KrF excimer laser (wavelength: 248 nm) was applied to the amorphous silicon film to polycrystallize it, whereby a polycrystalline silicon film 103 was formed. An application atmosphere was air and a substrate temperature was a room temperature. Excimer laser light was formed into a line on a surface to be irradiated by an optical system and the amorphous silicon film was scanned with a linear beam. Irradiation energy density was adjusted in a range of from 350 mj/cm² to 400 mj/cm².

When the amorphous silicon film 102 was irradiated with the linear excimer laser beam, it was instantly melted at the spot and was recrystallized while it was solidified. In this connection, the substrate 100 was heated at 500° C. for 60 minutes before the laser irradiation to release hydrogen from the amorphous silicon film 102 into a vapor phase.

(Forming of an Active Layer and a Gate Insulating Film) See FIG. 1(C).

A photoresist pattern was formed on the polycrystalline silicon film 103 and the polycrystalline silicon film 103 was patterned into a shape of an island by dry-etching to form active layers 104 and 105. The dry-etching was performed using etching gases of $CF_4$ and $O_2$ and the rate of flow of $CF_4$ was 50 sccm and the rate of flow of $O_2$ was 45 sccm.

A silicon oxide nitride film was formed as a gate insulating film 106 in a thickness of 50 nm with the plasma CVD apparatus. $SiH_4$ and $N_2O$ were used as the raw material gases. The rate of flow of $SiH_4$ was 4 sccm and the rate of flow of $N_2O$ was 400 sccm. When the film was formed, pressure was 0.3 Torr, a substrate temperature was 400° C., and RF power was 200 W.

Figure 1E:
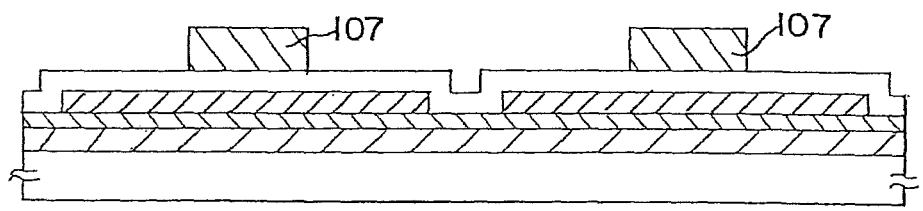
Figure 2A:
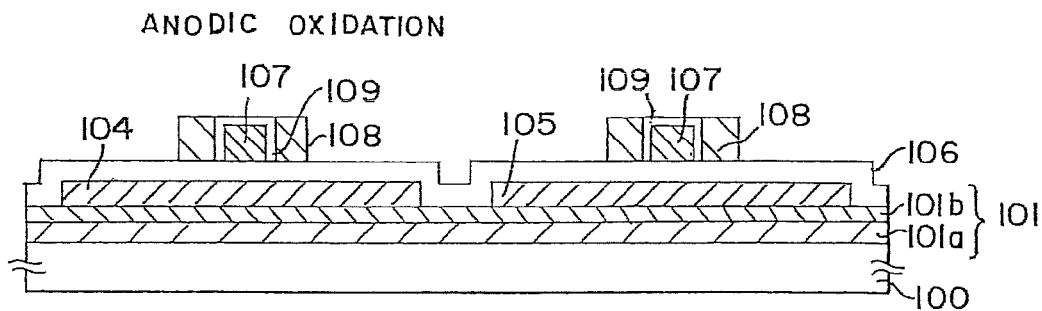
FIG. 2(A) to FIG. 2(D) is a cross-sectional view showing a process for manufacturing a CMOS circuit.
Figure 2B:
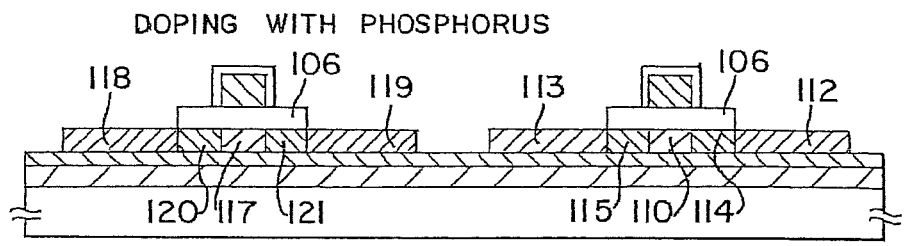
Figure 2C:
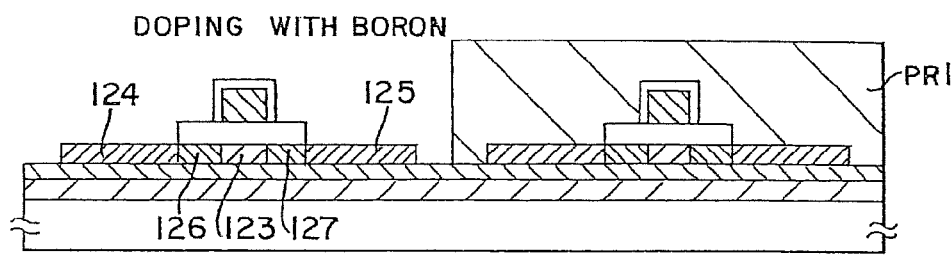
Figure 2D:
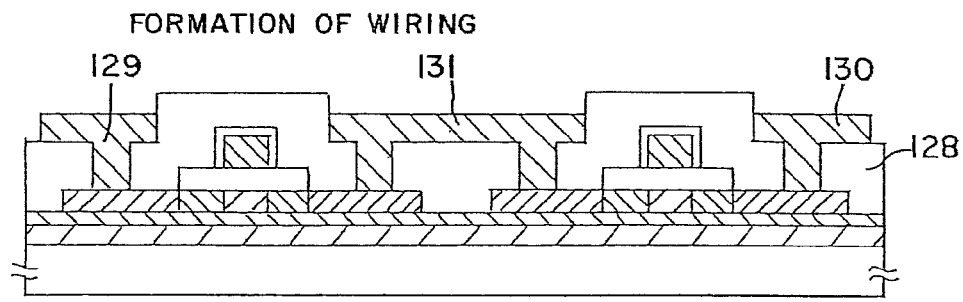

(Forming of a Gate Wiring) See FIG. 1(E).

An aluminum film was formed on the gate insulating film 106 in a thickness of 400 nm with a sputtering apparatus. A target was mixed with Sc and Sc was added about 0.18% by weight to the aluminum film.

The surface of the aluminum film was subjected to an anodic oxidation to form an anodic oxide film (not shown). In the anodic oxidation process, a voltage of 10 V was applied across an anode of the aluminum film and a cathode of platinum in an ethylene glycol solution containing 3% by weight of a tartaric acid. The anodic oxide film formed in this process has a thickness of about 1 nm and the object of this film is to improve the contact performance of the photoresist to be formed on the aluminum film. After the anodic oxidation process was finished, a photoresist pattern was formed (not shown) and the aluminum film was patterned by wet-etching to form a gate wiring 107. In the drawing, the gate wiring 107 is divided by the TFT, but it is common to the n-channel-type TFTs or the p-channel-type TFTs
(Anodic Oxidation Process) See FIG. 2(A).

Anodic oxidation was performed in a state in which the photoresist pattern used for patterning the gate wiring remained. The anodic oxidation was performed using a 3% by weight oxalic acid as an electrolytic solution with a voltage of 8 V applied across the anode and the cathode, whereby a porous anodic oxide film 108 was formed on the side of the gate wiring 107.

The photoresist pattern was removed and then an anodic oxidation was performed again using an ethylene glycol solution containing a 3% by weight tartaric acid as an electrolytic solution to form a dense barrier-type anodic oxide film 109.

In this anodic oxidation process, the electrolytic solution entered also the porous anodic oxide film 108 to form a gate wiring 107 coated with the anodic oxide film 109.
(Doping with Phosphorus) See FIG. 2(B).

The gate insulating film 106 was patterned using the gate wiring 107 and the anodic oxide film 108 as an etching mask. Then, the porous anodic oxide film 107 was removed. Then, in order to form the source region and the drain region of an n-channel-type TFT, the active layer 105 was doped with phosphorus (P).

Phosphorus was added by two doping processes with an ion doping apparatus using a $PH_3$ gas diluted to 5% with $H_2$ gas as a doping gas. A first doping was performed with a high acceleration voltage and a low dose under the following conditions: an acceleration voltage was 90 kV; RF power was 5 W; a set dose was $1.2\times10^{13}$ ions/cm$^2$. A second doping was performed with a low acceleration voltage and a high dose under the following conditions: an acceleration voltage was 10 kV; RF power was 20 W; a set dose was $5\times10^{14}$ ions/cm$^2$.

In this doping process, the concentration of phosphorus added to the active layers 104 and 105 was varied by the presence or absence of the gate insulating films 106 and 107, and channel forming regions 110 and 117, n$^+$-type high-concentration impurity regions 112, 113, 118, and 119, n$^-$-type low-concentration impurity regions 114, 115, 120, and 121 were formed in the active layers 104 and 105 in a self alignment manner. In the active layer of the n-channel-type TFT, the n$^+$-type high-concentration impurity regions 112 and 113 correspond to a source region and a drain region. An n$^-$-type and an n$^+$-type means n-type conductivity and that the former is lower in the concentration of phosphorus of the former than the latter.
(Doping with Boron) See FIG. 2(C).

The active layer 105 of the n-channel-type TFT was covered with a photoresist pattern PR1 and boron was added to the semiconductor layer 105 with the doping apparatus to form p-type source and drain regions. A $B_2H_6$ gas diluted to 5% with $H_2$ gas was used as a doping gas. Here, two doping processes were performed under different conditions. The first doping was performed under the following conditions: an acceleration voltage was 70 kV; RF power was 5 W; and set dose was $6\times10^{14}$ ions/cm$^2$. The second doping was performed under the following conditions: an acceleration voltage was 10 kV; RF power was 20 W; and set dose was $1.3\times10^{15}$ ions/cm$^2$.

As a result, in the active region 104 were formed a channel forming region 123, p$^+$-type high-concentration impurity regions 124 and 125, and p$^-$-type low-concentration impurity regions 126 and 127 in a self-alignment manner. The active layers 104 and 105 were irradiated with laser light to activate doped phosphorus and boron. A KrF excimer laser (wavelength: 248 nm) was used as a laser light source. The activation process was performed in the atmosphere with a substrate temperature set at a room temperature. A p$^-$-type and a p$^+$-type mean p-type conductivity and that the former is lower in the concentration of boron than the latter.
(Forming of an Interlayer Insulating Film and a Wiring) See FIG. 2(D).

Two insulating films of a silicon nitride film and a silicon oxide film were formed as interlayer insulating films 128 with the plasma CVD apparatus. First, the silicon nitride film was formed in a thickness of 25 nm using $SiH_4$, $NH_3$, and $N_2$ as the raw material gases under the following conditions: a substrate temperature was 325° C.; pressure was 0.7 Torr; and RF power was 300 W. Then, the silicon oxide film was formed in a thickness of 940 nm using TEOS (tetraethoxysilane) and $O_2$ as the raw material gases under the following conditions: a substrate temperature was 300° C.; pressure was 1.0 Torr; and RF power was 200 W.

A contact hole was made through the interlayer insulating film 128 to the active layers 104 and 105. As a conductive film constituting source and drain wirings, a laminated film made of a titanium (Ti) film having a thickness of 50 nm and an aluminum (Al) film having a thickness of 400 nm were sequentially formed with the sputtering apparatus. Silicon (Si) was added 2% by weight to the aluminum film. The laminated film made of the titanium film and the aluminum film was patterned to form source wirings 129, 130 and a drain wiring 131.

Finally, the substrate was subjected to a hydrogenation treatment in a hydrogen atmosphere at a substrate temperature of 300° C. for 120 minutes. The hydrogenation treatment electrically neutralizes defects and dangling bonds in the active layers 104 and 105.

The initial characteristics of the TFT formed by the above-mentioned processes were measured for each substrate and then a BT test was conducted to investigate the deterioration of the characteristics. The stress conditions of the BT test were as follows: substrate temperature was 150° C.; test duration was 1 hour; drain voltage VD was 0 V; source voltage VS=0 V; gate voltage VG=20 V (n-channel-type), and −20 V (p-channel-type). Also, the measurement values of channel length L and width W of the TFT to be measured were 5.6 μm for L and 7.5 μm for W for both of the n-channel type and the p-channel type.

FIG. 4 shows a drain current ID vs. a gate voltage VG characteristic curve of each substrate. A vertical axis is on a log scale. A solid line designates data before the BT test and a dotted line designates data after the BT test. Also, the data of the n-channel-type TFT is the data obtained in the case where the drain voltage VD was 1 V, and the drain voltage VD was −1 V for the p-channel-type TFT.

Figure 5A:
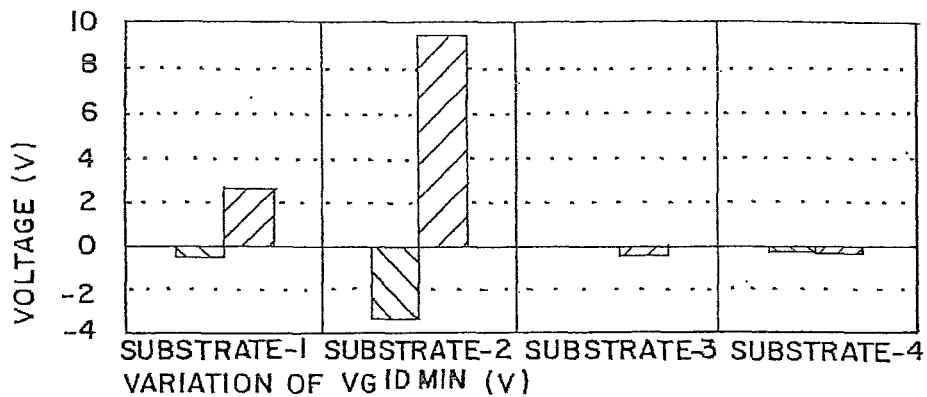
FIG. 5(A) to FIG. 5(C) is a graph showing the electrical characteristics of a TFT after a BT test.
Figure 5B:
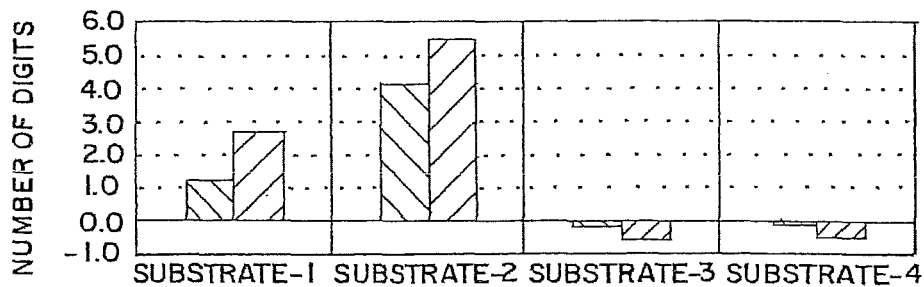
Figure 5C:
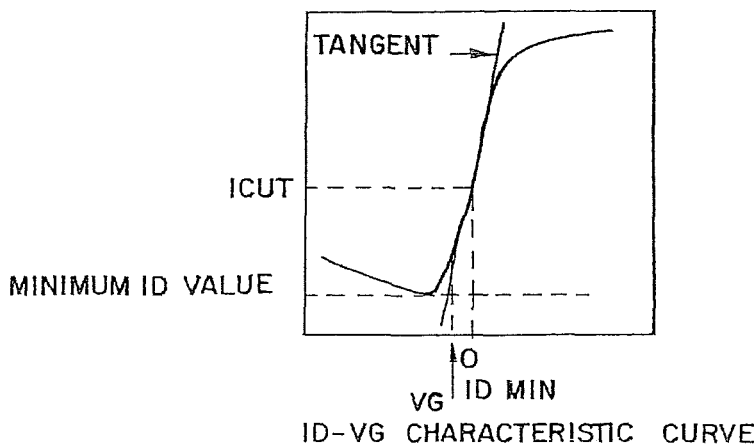

FIG. 5 is a graph showing variations in the characteristics of the TFT obtained by the BT test. FIG. 5(A) shows variations in a gate voltage $VG^{IDmin}$. The gate voltage $VG^{IDmin}$ means a value calculated from the ID-VG characteristic curve as is the case with a threshold voltage Vth. As is shown in FIG. 5(C), the gate voltage $VG^{IDmin}$ means a gate voltage at a point where, of tangents to the characteristic curve with a drain current ID on a log scale, a tangent having the maximum absolute value of gradient crosses a horizontal line passing the point of the minimum value of the drain current ID of the characteristic curve.

The data in FIG. 5(A) shows variations in the gate voltage $VG^{IDmin}$ before and after the BT test and a difference $\Delta VG^{IDmin}$ between the gate voltage $VG^{IDmin}$ before the test and the gate voltage $VG^{IDmin'}$ after the test=$VG^{IDmin'}$ −VG$^{IDmin}$. In this connection, in the substrate-3, since the difference ΔVG$^{IDmin}$ for the case of the n-channel-type TFT (L/W=5.6/7.5 μm) is 0.007, very small, nothing is shown in the graph.

FIG. 5(B) shows a change in the number of digits of a cut-off current Icut. The cut-off current Icut is defined by a drain current ID when the gate voltage VG is zero in the ID-VG characteristic curve, as shown in FIG. 5(C). As the cut-off current Icut decreases, power consumption decreases.

The data shown in FIG. 5(B) were calculated from log (Icut'−Icut), where the Icut was a value before the test and the Icut' was a value after the test.

It is easily seen from the data in FIG. 4 and FIG. 5 that it is the substrate-3 and the substrate-4 that show small variations in the characteristics of the TFT. As is shown in FIGS. 4(E) to (H), the characteristic curves of the substrate-3 and the substrate-4 slightly vary in a subthreshold region and hardly vary in the n-channel-type TFT.

Figure 4A:
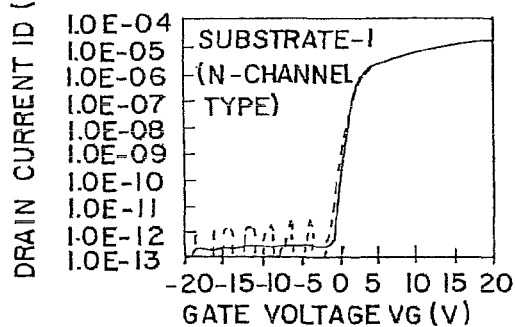
FIG. 4(A) to FIG. 4(H) is a graph showing the electrical characteristics of a TFT.
Figure 4B:
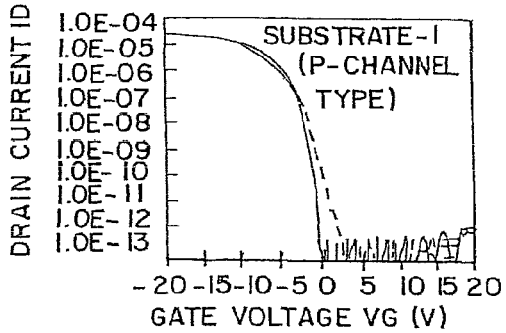
Figure 4C:
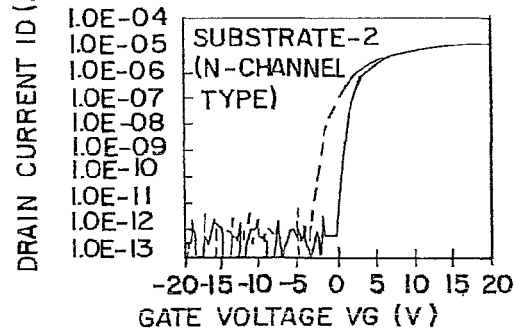
Figure 4D:
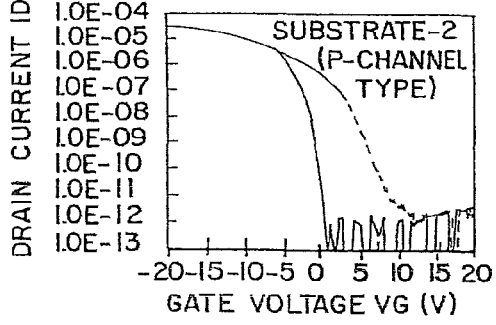
Figure 4E:
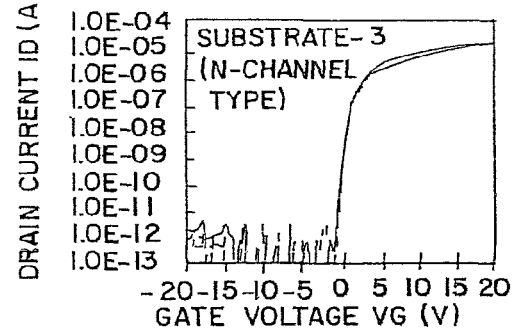

On the other hand, it is seen from the characteristic curves of the substrate-2 shown in FIGS. 4(C), (D), that the characteristic curves significantly vary in the subthreshold region and a heat treatment can decrease the deterioration (see FIGS. 4(A) and (B), which show the case of the substrate-1 corresponding to this).

Also, smaller variations in the ΔVG$^{IDmin}$ and ΔIcut shown in FIG. 5 means less deterioration of the TFT and higher reliability thereof. In the substrate-3 and the substrate-4, the ΔVG$^{IDmin}$ and the ΔIcut of the n-channel-type TFT are very little, which means that the reliability of the n-channel-type TFT, which has conventionally presented a problem of deterioration, is significantly improved.

Figure 4F:
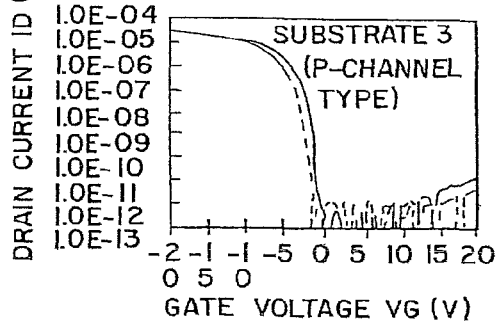
Figure 4G:
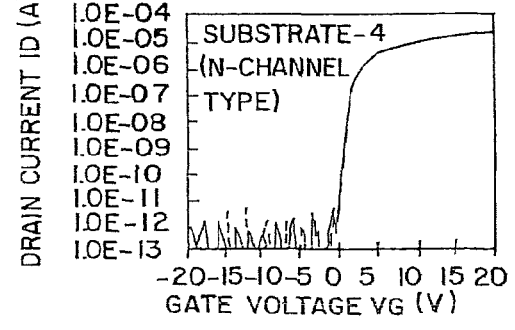
Figure 4H:
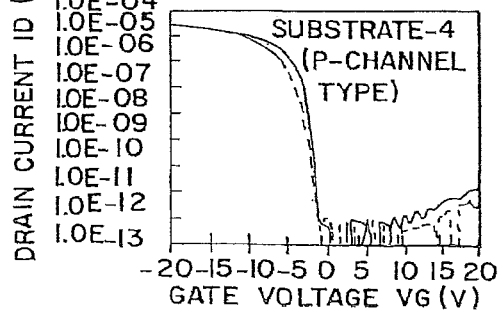

On the other hand, the ΔVG$^{IDmin}$ and the ΔIcut of the p-channel-type TFT are slightly larger than those of the n-channel-type TFT, but as is evident from the ID-VG characteristic curves in FIG. 4(F), (H), the ID-VG characteristic curves are shifted to a normally-off side and hence it is thought that there is no problem in operations as compared with the case in which the ID-VG characteristic curves are shifted to a normally-on side.

The ID-VG characteristic curve being shifted to a normally-off side means that it is shifted to a side in which a cut-off current Icut decreases, and the ID-VG characteristic curve being shifted to a normally-on side means that it is shifted to a side in which a cut-off current Icut increases.

In the substrate-1 and the substrate-2, the ID-VG characteristic curves of the n-channel-type TFT and the p-channel-type TFT are shifted to the normally-on side and hence it is understood that the TFTs of the substrate-3 and the substrate-4 have high reliability.

It can be understood from the above description that in order to prevent the deterioration of the TFT even if the insulating 101*a* which is not subjected to a heat treatment is used, the composition of the silicon oxide nitride constituting the insulating layer 101*a* is required to be in a suitable range. It is necessary at least to increase the content of nitrogen in the insulating layer 101*a* and to decrease the content of oxygen in the insulating layer 101*a*, as compared with the substrate-1 and the substrate-2.

In the insulating layers 101*a* in the substrate-1 and the substrate-2, a ratio of the concentration of nitrogen to the concentration of silicon was 0.22 and a ratio of the concentration of oxygen to the concentration of silicon was 1.86. An internal stress was a compressive stress in asdepo and after the heat treatment.

In the insulating layer 101*a* in the substrate-3, a ratio of the concentration of nitrogen to the concentration of silicon was 0.73 and a ratio of the concentration of oxygen to the concentration of silicon was 0.80. An internal stress was a tensile stress in asdepo and after the heat treatment.

In the insulating layer 101*a* in the substrate-4, a ratio of the concentration of nitrogen to the concentration of silicon was 1.28 and a ratio of the concentration of oxygen to the concentration of silicon was 0.17. An internal stress was a tensile stress in asdepo and after the heat treatment.

The above-mentioned ratios of the concentrations of nitrogen and oxygen to the concentration of silicon were calculated from the ratios of the compositions measured with RBS and shown in FIG. 3.

As described, it is necessary to adjust the concentrations of nitrogen and oxygen so that the insulating layer 101*a* has a tensile stress. In order to prevent the deterioration of the TFT and to make the insulating layer 101*a* (silicon oxide nitride layer) have the tensile stress, it is necessary to adjust a ratio of the concentration of nitrogen to the concentration of silicon to from 0.3 to 1.6, more preferably, to from 0.6 to 1.4. Also, it is necessary to adjust a ratio of the concentration of oxygen to the concentration of silicon to from 0.1 to 1.7, more preferably, to from 0.1 to 1.0.

In this connection, in the case where the rate of flow of $NH_3$ was increased as compared with the substrate-4 when the insulating layer 101*a* was formed, when the substrate was heated at a temperature of about 600° C. for several hours after the semiconductor film was formed, it was observed that the film was separated. Therefore, in the case where the substrate is heated at about 600° C. for several hours, it is preferable to adjust the upper limit of the ratio of the concentration of nitrogen to the concentration of silicon to 1.3 and to adjust the lower limit of the ratio of the concentration of oxygen to the concentration of silicon to 0.2.

Also, the concentrations of nitrogen in the insulating layer 101*a* in the substrates measured with a SIMS were $2 \times 10^{20}$ atoms/cm$^3$ for the substrate-1 and the substrate-2, and $8 \times 10^{21}$ atoms/cm$^3$ for the substrate-3. Accordingly, the concentration of nitrogen in the insulating layer 101*a* is adjusted to more than $2 \times 10^{20}$ atoms/cm$^3$, more preferably more than $1 \times 10^{21}$ atoms/cm$^3$, with the ratio of the composition of nitrogen to that of silicon in the above range.

Also, there is a refractive index as a physical property reflecting the whole composition in addition to the above-mentioned ratios of compositions of nitrogen and oxygen to that of silicon, and it is necessary to adjust film forming conditions such that the refractive index of the insulating layer 101*a* to a wavelength of 632.8 nm ranges from 1.5 to 1.8, more preferably, from 1.7 to 1.8, as shown in FIG. 3.

In the present preferred embodiment, while the insulating film having the silicon oxide nitride layer 101*a* and the insulating layer 101*b* containing Si and O was applied to the underlying film 101, when the insulating film is applied to the underlying film, it is recommended that the thickness of the silicon oxide nitride layer 101*a* be from 50 nm to 200 nm. Also, it is recommended that the thickness of the insulating layer 101*b* containing Si and O be from 10 nm to 300 nm, more preferably, from 10 nm to 50 nm.

The insulating film made of the insulating layers 101*a*, 101*b* in the present preferred embodiment can be applied to the gate insulating film of the bottom-gate-type TFT in addition to the underlying film formed over the whole surface of the substrate. In this case, it is recommended that the thickness of the silicon oxide nitride layer 101*a* be from 50 nm to 100 nm and the thickness of the insulating layer 101*b* containing Si and O be from 50 nm to 100 nm to thereby increase a dielectric property as compared with the case where it is applied to the underlying film.

Preferred Embodiment 2

While the insulating layer 101b containing Si and O was formed of the silicon oxide film using TEOS and $O_2$ in the preferred embodiment 1, it can be formed of a silicon oxide nitride film. In this case, the silicon oxide nitride film may be formed using $SiH_4$ and $N_2O$ as the raw material gases.

For example, it is recommended that the silicon oxide nitride film be formed as the underlying insulating layer 101a under the same conditions as is used for the insulating layer 101a of the substrate-3, and that the silicon oxide nitride film be formed as the insulating layer 101b under the same conditions as is used for the insulating layer 101b of the substrate-1.

The insulating layer 101a made of silicon oxide nitride was formed in a film thickness of 100 nm and the insulating layer 101b made of silicon oxide nitride was formed in a film thickness of 200 nm. There was no problem in a dielectric property. The insulating film made of this laminated film can also be applied to the gate insulating film of a bottom-gate-type TFT.

Also, while the underlying film 101 had a two-layer structure, it may have a three-layer structure. For example, it is recommended that an insulating layer made of silicon oxide using TEOS and $O_2$ as the raw material be further formed on the silicon oxide nitride layers 101a and 101b to thereby form an semiconductor film constituting an active layer in contact with the silicon oxide layer. It is needless to say that the insulating film having this three-layer structure can be applied to the gate insulating film of the bottom-gate-type TFT.

The embodiments in accordance with the present invention will be described using FIGS. 6 to 12.

Embodiment 1

In the present embodiment, there will be described an active-matrix-type liquid crystal panel in which a pixel matrix circuit is integrated with a driver circuit on the same substrate. Also, the structure of a TFT capable of effectively preventing the deterioration will be described in the present embodiment.

Figure 11:
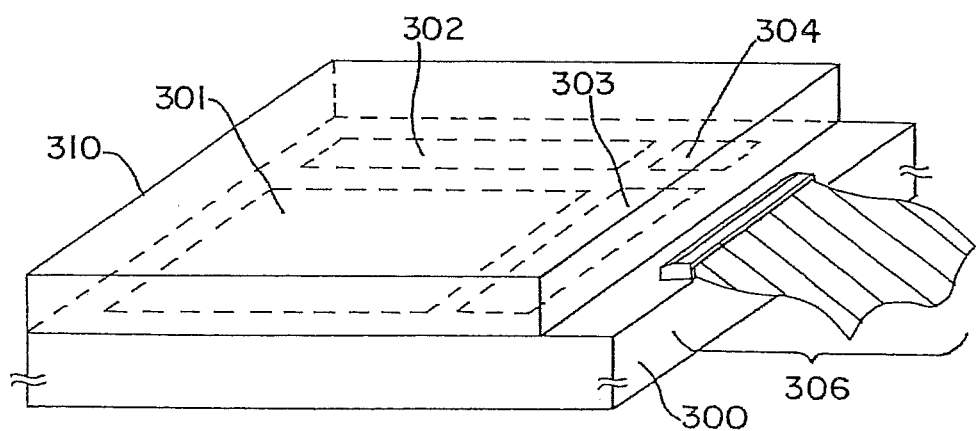
FIG. 11 is a schematic view of an active matrix type liquid crystal panel.

A liquid crystal display will schematically be illustrated in FIG. 11. An active matrix substrate is bonded to an opposite substrate with a gap between them and the gap is filled with liquid crystal.

An active matrix substrate 300 includes a pixel matrix circuit 301, a gate driver circuit 302, a source driver circuit 303, and a signal processing circuit 304, each of which is formed of a TFT made on the substrate. The gate driver circuit 302 and the source driver circuit 303 are used for driving the TFT of the pixel matrix circuit 301. The signal processing circuit 305 is a circuit for processing various kinds of signals required to display images and means a memory circuit, a D/A (or A/D) converter circuit, a pulse generator circuit, a signal dividing circuit, a γ correction circuit, and the like.

On the active matrix substrate 300, an external terminal is formed at the same time when a TFT is manufactured. A FPC (flexible print circuit) 306 is fixed to the external terminal. In general, it is a liquid crystal panel provided with the FPC that is called a liquid crystal module.

Meanwhile, as for the opposite substrate 310, a transparent conductive film made of an ITO film is formed on a glass substrate and is covered with an orientated film. If necessary, a color filter and a black matrix are formed between the transparent conductive film and the substrate. The transparent conductive film becomes the opposite electrode of the pixel electrode of the pixel matrix circuit and an electric field corresponding to an image data is formed between the pixel electrode and the transparent conductive electrode to drive the liquid crystal put in the gap between them.

Figure 6:
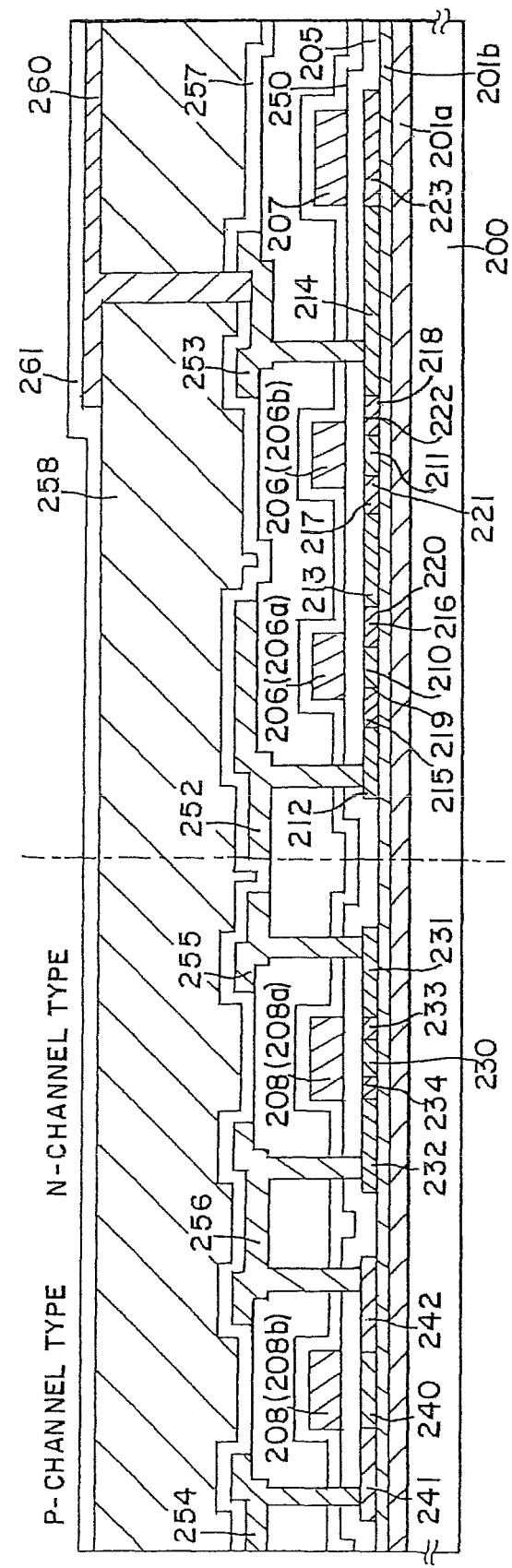
FIG. 6 is a cross-sectional view of an active matrix substrate.
Figure 10:
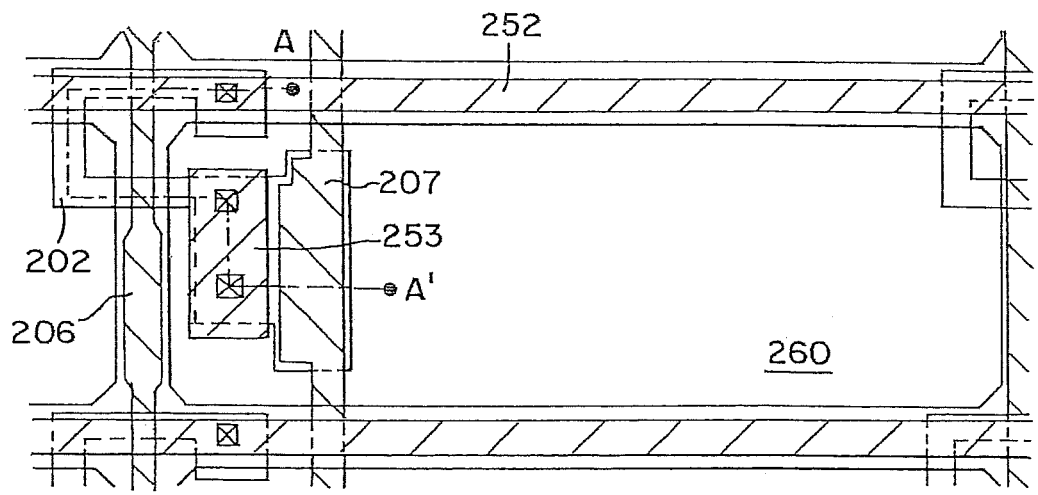
FIG. 10 is a plan view of a pixel matrix circuit.

FIG. 6 is a cross-sectional view of the active matrix substrate. The cross-sectional structure of one pixel of a pixel matrix circuit will be shown in the right hand side of the drawing and a CMOS circuit as a basic constitution of the driver circuits 303 and 304 will be shown in the left hand side of the drawing. Also, FIG. 10 is a plan view of the pixel matrix circuit.

As is shown in FIG. 6, an underlying film is formed which is made of insulating layers 201a, 201b covering the surface of a glass substrate 200. The insulating layers 201a, 201b are different from each other in the composition. The insulating layer 201a is made high in the concentration of nitrogen to improve a passivation effect. Meanwhile, the insulating layer 201b is made lower in the concentration of nitrogen than the insulating layer 201a to lower an interface level to an active layer.

A pixel TFT used for the pixel matrix circuit is an n-channel-type TFT and has a double gate structure. An active layer 202 crosses a gate wiring 206 at two points via a gate insulating film 205 and further crosses a retention capacitance wiring 207.

In the active layer 202, there are formed two channel forming regions 210, 211, three $n^+$-type high-concentration impurity regions 212 to 214, and $n^-$-type low-concentration impurity regions 215 to 223. The low-concentration impurity regions 215 to 219 are lower in the concentration of phosphorus than the high-concentration impurity regions 212 to 214 to thereby function as high resistance regions. The low-concentration impurity regions 215 to 218 overlap the gate wiring 206 (electrodes 206a and 206b) and hence effectively prevent deterioration caused by hot carriers. The low-concentration impurity regions 219 to 222 do not overlap the gate wiring (electrode) and hence effectively reduce an off current.

Also, the low-concentration impurity regions 223 constitutes the electrode of a retention capacitance. The retention capacitance is a condenser having the low-concentration impurity region 223 and a retention capacitance electrode 207b as electrodes and the gate insulating film 205 as a dielectric, and is electrically connected to the pixel TFT by the low-concentration impurity region 223.

In the driver circuit, the active layers of the n-channel-type TFT and the p-channel-type TFT cross a gate wiring 208 across the gate insulating film 205. In the active layer of the n-channel-type TFT, there are formed a channel forming region 230, $n^+$-type high-concentration impurity regions 231 and 232, and $n^-$-type low-concentration impurity regions 233 and 234. The $n^-$-type low-concentration impurity regions 233 and 234 are lower in the concentration of phosphorus than the high-concentration impurity regions 231 and 232 and becomes high resistance regions. The $n^-$-type low-concentration impurity regions 233 and 234 overlap the gate wiring 208 (electrode 208a) and hence effectively prevent the deterioration caused by the hot carriers. Meanwhile, in the active layer of the p-channel-type TFT, there are formed channel forming regions 240 and $p^+$-type high-concentration impurity regions 241 and 242.

In this connection, in the present specification, portions where the gate wirings 206 and 208, the capacitance wiring 207 cross the active layers 202 to 204 are the electrodes designated by reference characters 206a, 206b, 207a, 208a, and 208b.

Further, as shown in FIG. 6, on the glass substrate 200, there is formed a silicon nitride film 250 for protecting the gate wirings 206 and 208 and the retention-capacitance wiring 207. On the silicon nitride film 250, there is formed an interlayer insulating film 251, and on the interlayer insulating film 251, there are formed the source wiring 252 and the drain electrode 253 of the pixel matrix circuit, and the source wirings 254 and 255 and the drain wiring 256 of the driver circuit. These wirings and electrode are covered with a silicon nitride film 257. The silicon nitride film 257 is formed as a passivation film for preventing moisture or impurities from entering the TFT. The silicon nitride film 257 is covered with a planarization film 258 made of a resin material. A pixel electrode 260 made of ITO is connected to the TFT on the surface of the planarization film 258 and an oriented film 261 is formed on the uppermost surface thereof.

A process for manufacturing the active matrix substrate will hereinafter be described with reference to FIGS. 7 to 9.
(Forming of an Underlying Film, an Active Layer, and a Gate Insulating Film) See FIG. 7(A).

The glass substrate 200 is cleaned and then an underlying film made of insulating layers 201a and 201b are formed in contact with the glass substrate 200.

First, a silicon oxide nitride film is formed as the insulating layer 201a in a thickness of 100 nm by the use of gases of $SiH_4$, $NH_3$, $N_2O$ as the raw material gas under the following conditions: rate of flow of $SiH_4$ is 10 sccm; rate of flow of $NH_3$ is 100 sccm; rate of flow of $N_2O$ is 20 sccm; and when the film is formed, substrate temperature is 300° C., pressure is 0.3 Torr and RF power is 200 W.

On the insulating layer 201a is formed a silicon oxide nitride film as the insulating layer 201b in a thickness of 200 nm with the plasma CVD apparatus by the use of gases of $SiH_4$ and $N_2O$ as the raw material gases under the following conditions: rate of flow of $SiH_4$ is 4 sccm; rate of flow of $N_2O$ is 400 sccm; and when the film is formed, substrate temperature is 300° C., pressure is 0.3 Torr, and RF power is 200 W.

An amorphous silicon film is formed on the underlying film 201b without exposing the surface of the underlying film 201b to the atmosphere by the use of $SiH_4$ gas as the raw material gas under the following conditions: rate of flow of $SiH_4$ is 100 sccm, and when the film is formed, pressure is 0.5 Torr and RF power is 20 W.

An acetic acid water solution containing nickel (Ni) is applied to the surface of the amorphous silicon film using a spin coater. In this process, Ni as an element facilitating crystallization is added to the amorphous silicon film. The substrate 200 is heated in an electric furnace at 500° C. for 1 hour to release hydrogen in the amorphous silicon film into a vapor phase and then the substrate is heated in the electric furnace in a nitrogen atmosphere at 500° C. for 4 hours to crystallize the amorphous silicon film to form a crystalline silicon film.

Also, another crystallization method is a method using a pulse generating YAG laser or $YVO_4$ laser. In particular, high power and high pulse oscillation frequency can be produced by the use of a laser apparatus of a laser diode exciting type. For laser annealing for crystallization, any of the second harmonic (532 nm), the third harmonic (354.7 nm), and the fourth harmonic (266 nm) of the solid-state laser like these is used: for example, a laser pulse oscillation frequency ranges from 1 Hz to 20000 Hz (preferably, from 10 Hz to 10000 Hz), a laser energy density ranges from 200 mJ/cm² to 600 mJ/cm² (typically, from 300 mJ/cm² to 500 mJ/cm²).

A linear beam is applied to the whole surface of the substrate. At this time, an overlap ratio of the linear beam is from 80% to 90%. The use of the second harmonic can transmit heat uniformly in the semiconductor layer to crystallize it even if the range of energy applied is slightly varied. This permits a processing margin and hence reduces the variations in crystallization. Also, high pulse frequency increases a throughput.

The crystalline silicon film is patterned in a shape of an island by dry-etching to form the active layer 202 of the pixel TFT, the active layers 203, 204 of the n-channel-type TFT and the p-channel-type TFT of the driver circuit. The gate insulating film 205 is formed over the active layers 202 to 204. A silicon oxide nitride film is formed as the gate insulating film 205 in a thickness of 150 nm with the plasma CVD apparatus using $SiH_4$ and $N_2O$ as the raw material gases under the following conditions: rate of flow of $SiH_4$ is 4 sccm; rate of flow of $N_2O$ is 400 sccm; and when the film is formed, pressure is 0.3 Torr, substrate temperature is 400° C. and RF power is 200 W.
(Doping Process of Phosphorus) See FIG. 7(B).

A photoresist pattern PR11 is formed on the gate insulating film 205. Regions where channels of the active layers 202 and 203 are formed are selectively covered with the photoresist pattern PR11 and the active layer 204 is wholly covered with it. Phosphorus is added thereto with an ion doping apparatus. A $PH_3$ gas diluted with hydrogen is used as a doping gas. In order to add phosphorus to the active layers 202 and 203 through the gate insulating film 205, an acceleration voltage is set at a higher value of 80 keV. In the doping process, n⁻-type low concentration impurity regions 301 to 303 are formed in the active layer 202 and n⁻-type low concentration impurity regions 304 and 305 are formed in the active layer 203. It is preferable that the concentration of phosphorus in these low concentration impurity regions 301 to 305 ranges from $1 \times 10^{16}$ atoms/cm³ to $1 \times 10^{19}$ atoms/cm³, and it is set at $1 \times 10^{18}$ atoms/cm³ this time.
(Forming of a Conductive Film) See FIG. 7(C).

The resist mask PR11 is removed and then a conductive film 306 constituting a gate wiring is formed on the surface of the gate insulating film 205. Here, a film including a tantalum film and a tantalum nitride film laminated thereon is formed as the conductive film 306 by a sputtering method.

The conductive film 306 is made of a single layer film or a laminated film made of a conductive material whose main component is an element selected from the group consisting of Ta, Ti, Mo, W, Cr, and Al, and silicon containing phosphorus or silicide. For example, such a composition as WMo, TaN, MoTa, $WSi_x$ (2.4<x<2.7) can be used.
(Doping with Boron) See FIG. 8(A).

In order to pattern a conductive film 212, a photoresist pattern PR12 is formed on the conductive film 212. The conductive film 212 is patterned by wet-etching by the use of the photoresist pattern PR12. Masks 206m, 208m are formed on the active layers 202, 203 of the n-channel-type TFT so as to function as doping masks. A gate electrode 208b having a final shape is formed on the active layer 204 of the p-channel-type TFT. After doping, doped phosphorus and boron is activated by a heat treatment at 450° C.

The substrate is doped with boron in the ion doping apparatus with the photoresist pattern PR12 left. A diborane ($B_2H_6$) gas diluted with hydrogen is used a doping gas and an acceleration voltage is 80 keV. A channel forming region 240 and p⁺-type high-concentration impurity regions 241 and 242 are formed in the active layer 204 in a self-alignment manner. The concentration of boron of the p⁺-type high-concentration impurity regions 241 and 242 is $2 \times 10^{20}$ atoms/cm³.
(Forming of a Wiring) See FIG. 8(B).

The photoresist pattern PR12 is removed and then a new photoresist pattern PR13 is formed. The photoresist pattern 13 is used for patterning the masks 206m and 208m to form gate electrodes 206a and 208a, and the capacitance electrode 207a and for protecting the active layer of the p-channel type TFT.

The masks 206m and 208m are patterned by a dry-etching method using the photoresist pattern PR13 to complete the gate wirings 206 and 208 and a capacitance wiring 207 as shown in the drawing. In the n⁻-type low concentration impurity regions 301 to 303, regions overlapping the gate electrodes 206a and 206b of the pixel TFT are defined as the n⁻-type low concentration impurity regions 219 to 222.
(Doping with Phosphorus) See FIG. 9(A).

The photoresist pattern PR13 is removed and then a photoresist pattern PR14 is formed and an n⁺-type region is formed by doping. In the pixel TFT, the electrode 206 and a part of the n⁻-type low-concentration impurity regions 301 to 303 are covered with the photoresist pattern PR14 to define the low-concentration impurity regions 219 to 222 not overlapping the gate electrodes 206a and 206b. In the n-channel type TFTs of a retention capacitance portion and a CMOS circuit, the photoresist pattern PR14 is formed only on the electrodes 207a and 208a, and the active layer of the p-channel-type TFT is wholly covered with the photoresist pattern PR14.

The substrate is doped with phosphorus in the ion doping apparatus using a $PH_3$ gas diluted with hydrogen. An acceleration voltage is set at a higher value of 80 keV. In the active layers 203 and 204, there are formed n⁺-type high-concentration impurity regions 212 to 214, 231, 232. It is recommended that the concentration of phosphorus of these n⁺-type high-concentration impurity regions be $1 \times 10^{19}$ atoms/cm³ to $1 \times 10^{21}$ atoms/cm³, and in this case, it is $1 \times 10^{20}$ atoms/cm³. In this doping process, the impurity region of the n-channel type TFT is completed.
(Forming of a Wiring and an Electrode) See FIG. 9(B).

A silicon nitride film 250 is formed by the plasma CVD method over the surface of the gate insulating film 205, gate wirings 206 and 208 and the retention capacitance wiring 207. The thickness of the silicon nitride film 250 is 50 nm. The substrate is heated at 600° C. to activate the doped phosphorus and boron.

An interlayer insulating film 251 is formed on the silicon nitride film 250. Here, a silicon oxide film is formed in a thickness of 940 nm by the plasma CVD method using TEOS and $O_2$ gas as the raw material gas. A predetermined resist mask is formed and then contact holes reaching each active layer are formed in the silicon nitride film 125 and the interlayer insulating film 126 by etching treatment. A Ti film, an Al film containing Ti, and a Ti film are formed sequentially in 100 nm, 300 nm, and 150 nm, respectively, and this three layers are patterned to form a source wiring 252, a drain electrode 253, source wirings 254, 255, and a drain wiring 256. The pixel TFT and the CMOS circuit are completed in the above-mentioned processes.
(Forming of a Pixel Electrode) See FIG. 6.

Next, in order to cover the pixel TFT and the CMOS circuit, the silicon nitride film 257 is formed on the whole surface of the substrate by the plasma CVD method. Next, an acrylic film is formed as a planarization film 258 by the use of a spin coater. The planarization film 258 and the silicon nitride film 257 are etched to form a contact hole reaching the drain electrode 253. An ITO film is formed by the sputtering method and is patterned to form a pixel electrode 260. An oriented film made of polyimide is formed on the whole surface of the substrate 200. In this manner, an active matrix substrate is completed.

The active matrix substrate and the opposite substrate are modularized by the publicly-known cell assembly process to complete a liquid crystal panel shown in FIG. 11.

While the n⁻-type low-concentration impurity region overlapping the gate electrode is formed in the n-channel type TFT on the active matrix substrate in the present preferred embodiment, the formation of the low-concentration impurity region like this makes a current easily leak in an OFF state (in a state where a reverse bias voltage is applied) and hence the low-concentration impurity region is not necessarily required to be formed in the pixel TFT in which the leak of current in the OFF state becomes a problem.

While a liquid crystal display device has been described in the present embodiment, the TFT of the present embodiment can also be applied to an organic EL (electroluminescence) device. Also, if a photoelectric conversion layer using amorphous silicon is connected to the TFT of the present embodiment, it can also be applied to an optical sensor.

In the present embodiment, the TFT of a planar type as a top gate type was manufactured, but the TFT may be a bottom gate type such as an inverted stagger type. The use of the underlying film of the present embodiment can prevent the impurities contained in the glass substrate such as Na⁺ ions or the like from entering the gate insulating film.

Embodiment 2

In the present embodiment, an example of manufacturing an EL display device using the present invention will be described. In this connection, FIG. 12(A) is a plan view of an EL display device in accordance with the present invention and FIG. 12(B) is a cross-sectional view thereof.

Figure 12A:
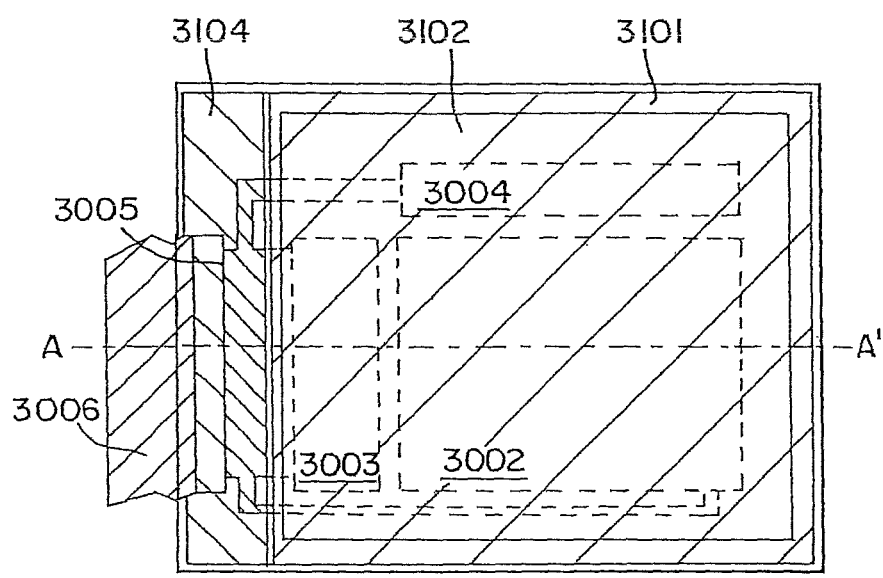
FIG. 12(A) and FIG. 12(B) is a plan view and a cross-sectional view of an active matrix type EL display device.

In FIG. 12(A), a reference numeral 3001 designates a substrate, a reference numeral 3002 designates a pixel part, a reference numeral 3003 designates a source side driver circuit, and a reference numeral 3004 designates a gate side driver circuit, and each driver circuit leads to a FPC (flexible printed circuit) 3006 via a wiring 3005, and is connected to an external device.

Here, a first sealing member 3101, a covering member 3102, a filling material 3103 and a second sealing member 3104 are provided such that they surround the pixel part 3002, the source side driver circuit 3003, and the gate side driver circuit 3004.

Figure 12B:
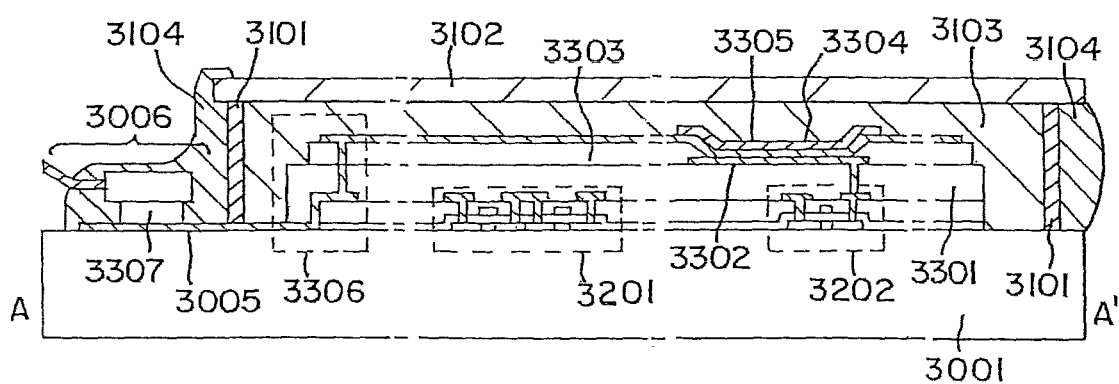

Also, FIG. 12(B) corresponds to a cross-sectional view taken on a line A-A' in FIG. 12(A). On the substrate 3001, there are formed driving TFTs 3201 included in the source side driver circuit 3003(here are shown an n-channel type TFT and a p-channel type TFT) and a pixel TFT 3202 included in the pixel part 3002 (here are shown a TFT controlling a current to an EL device).

In the present embodiment, a TFT having the same structure as the driving circuit shown in FIG. 1 is used for the driving TFT 3201. Also, a TFT having the same structure as the pixel part shown in FIG. 1 is used for the pixel TFT 3202.

On the driving TFT 3201 and the pixel TFT 3202 are formed an interlayer insulating film (planarization film) 3301 made of resin material and a pixel electrode (negative electrode) 3302 electrically connected the drain of the pixel TFT 3202 is formed thereon. A conductive film having a lightproof property (typically, a conductive film whose main component is aluminum, copper, or silver, or a laminated film of the same and the other conductive film) can be used as the pixel electrode 3302. In the present embodiment, an aluminum alloy is used as the pixel electrode.

On the pixel electrode 3302 is formed an insulating film 3303 and an opening is formed in the insulating film 3303 over the pixel electrode 3302. In the opening, an EL (electroluminescence) layer 3304 is formed over the pixel electrode 3302. A publicly known organic EL material or inorganic EL material can be used as the EL layer 3304. Also, the organic EL material includes a low-molecular (monomer) material and a high-molecular (polymer) material and either of them may be used.

A publicly known technique may be used as a method for forming the EL layer 3304. Also, it is recommended that the structure of the EL layer be a laminated structure made by laminating a hole-injected layer, a hole-carrying layer, a light-emitting layer, an electron-carrying layer, or an electron-injected layer in free combination or a single layer structure of the layers.

On the EL layer 3304 is formed a positive electrode 3305 made of a transparent conductive film. A compound of indium oxide and tin oxide or a compound of indium oxide and zinc oxide can be used as the transparent conductive film. Also, it is desirable that moisture and oxygen existing at an interface between the positive electrode 3305 and the EL layer 3304 is removed to the utmost. Therefore, it is necessary to put such a thought into forming them that both of them are sequentially formed in a vacuum or that the EL layer 3304 is formed in a nitrogen atmosphere or in a rare gas atmosphere to thereby form the positive electrode 3305 in no contact with oxygen or moisture. In the present embodiment, both of them can be formed in the above-mentioned manner by the use of a film forming device of a multi-chamber type (cluster tool type).

The positive electrode 3305 is electrically connected to a wiring 3005 in a region shown by a reference numeral 3306. The wiring 3005 is a wiring for applying a predetermined voltage to the positive electrode 3305 and is electrically connected to the FPC 3006 via a conductive material 3307.

In the manner described above, an EL device including the pixel electrode (negative electrode) 3302, the EL layer 3304 and the positive electrode 3305 is formed. This EL device is surrounded by the first sealing member 3101 and the covering member 3102 bonded to the substrate 3001 by the first sealing member 3101 and is filled with the filling material 3103.

A glass plate, a FRP (fiberglass-reinforced plastic) plate, a PVF (poly(vinyl fluoride)) film, a Mylar film, a polyester film, or an acrylic film can be used as the covering member 3102. In this embodiment, a transparent material is used because the light radiates from the EL device toward the covering member 3102.

However, in the case where the light radiates from the EL device toward the side opposite to the covering member, it is not necessary to use a transparent material but a metallic plate (typically, a stainless plate), a ceramic plate, or a sheet having a structure in which an aluminum foil is sandwiched by PVF films or Mylar films can be used.

Also, an ultraviolet-cured resin or a thermosetting resin can be used as the filling material 3103, and PVC (poly(vinyl chloride)), acrylic, polyimide, epoxy resin, a silicone resin, PVB (poly(vinyl butyl)), or EVA (ethylene vinyl acetate) can be used. A hygroscopic substance (preferably, barium oxide) put in the filling material 3103 can prevent the deterioration of the EL device. In this connection, in the present embodiment, a transparent material is used so that light from the EL device can pass the filling material 3103.

Also, the filling material 3103 may include a spacer. Here, if the spacer is formed of barium oxide, the spacer itself can have moisture absorbency. Also, if the spacer is provided, it is also effective to form a resin film on the positive electrode 3305 as a buffer layer relieving pressure from the spacer.

Also, the wiring 3005 is electrically connected to the FPC 3006 via the conductive material 3307. The wiring 3005 transmits a signal sent to the pixel part 3002, the source side driver circuit 3003, and the gate side driver circuit 3004 to the FPC 3006 and is electrically connected to an external device by the FPC 3006.

Also, in the present embodiment, the second sealing member 3104 is provided in such a way that it covers the exposed portion of the first sealing member 3101 and a part of the FPC 3006 to thereby thoroughly shut the EL device from the outside air. In this way, the EL display device having a cross-sectional structure shown in FIG. 12(B) is manufactured.

Embodiment 3

Figure 13A:
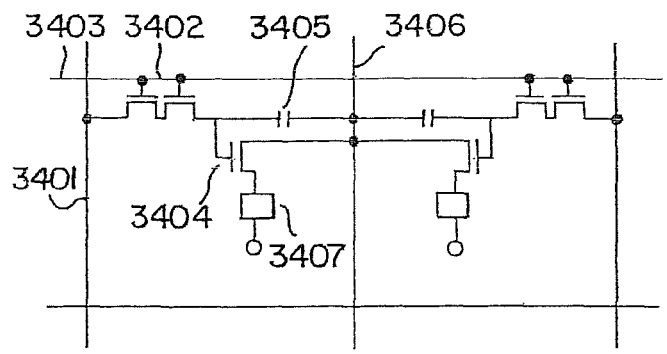
FIG. 13(A) to FIG. 13(C) shows illustrations of a pixel part of an active matrix type EL display device.
Figure 13B:
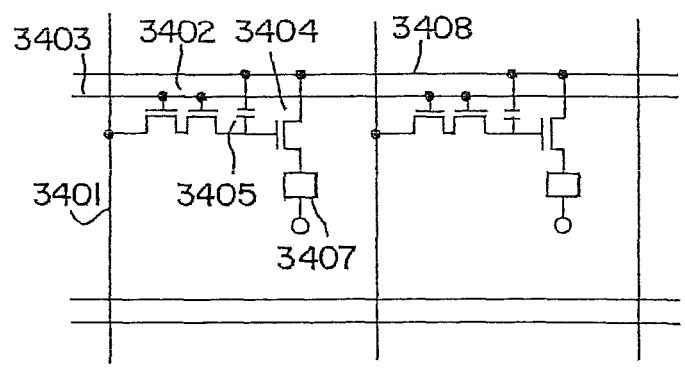
Figure 13C:
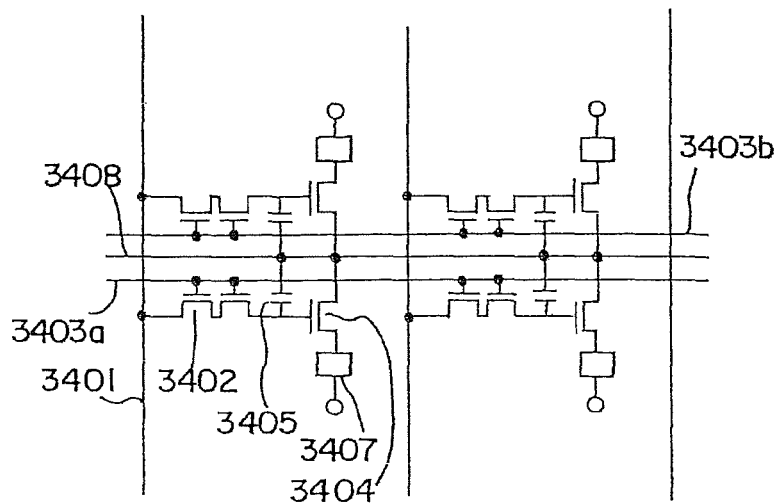

In the present embodiment, an example of a pixel structure applicable to the pixel part of an EL display device shown in an embodiment 10 will be shown in FIG. 13(A) to (C). In this connection, in the present embodiment, a reference numeral 3401 designates the source wiring of a switching TFT 3402, a reference numeral 3403 designates the gate wiring of a switching TFT 3402, a reference numeral 3404 designates a current control TFT, a reference numeral 3405 designates a condenser, reference numerals 3406 and 3408 designate current supply wirings, and a reference numeral designates 3407 designates an EL element.

FIG. 13(A) is an example in the case where the current supply wiring 3406 is common to two pixels. In other words, this example is characterized in that two pixels are formed symmetrically with respect to a line of the current supply wiring 3406. In this case, the number of current supply wirings can be reduced and hence the pixel part can be made in higher definition.

Also, FIG. 13(B) is an example having the current supply wiring 3408 in parallel to the gate wiring 3403. In this connection, while the example shown in FIG. 13(B) has a structure in which the current supply wiring 3408 does not overlap the gate wiring 3403, if both wirings are formed in different layers, they are arranged such that they overlap each other via an insulating film. In this case, since the current supply wiring 3408 and the gate wiring 3403 can share an area designed specifically therefor, the pixel part can be made in still higher definition.

Also, an example shown in FIG. 13(C) is characterized in that the current supply wiring 3408 is in parallel to the gate wiring 3403, as is the case with the structure shown in FIG. 13(B), and that two pixels are formed symmetrical with respect to a line of the current supply wiring 3408. Also, it is also effective to arrange the current supply wiring 3408 such that it overlaps any one of the gate wirings 3403. In this case, the number of current supply wirings can be reduced and hence the pixel part can be made in still higher definition.

Embodiment 4

A CMOS circuit and a pixel matrix circuit manufactured by the present invention can be applied to various electro-optical devices (active matrix type liquid crystal display, active matrix type EL display, active matrix type EC display). In other words, the present invention can be applied to an electronic product having these electro-optical device as a display medium.

These electronic products are a video camera, a digital camera, a projector (rear type or front type), a head-mounted display (goggle type display), a car navigation, a car stereo, a personal computer, a portable digital assistant (a mobile computer, a cellular phone, a digital book, or the like), and the like. Examples of these electronic products will be shown in FIG. 14, FIG. 15, and FIG. 16.

Figure 14A:
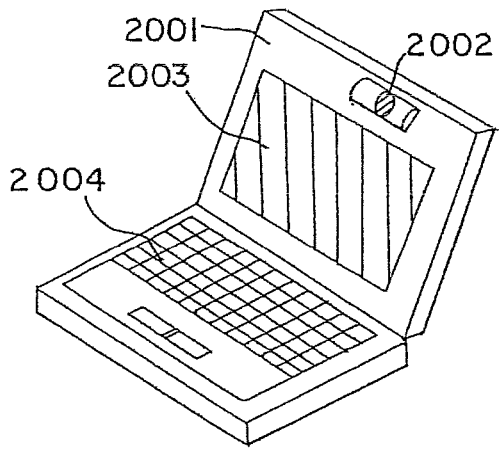
FIG. 14(A) to FIG. 14(F) shows illustrations of electronic products.

FIG. 14(A) is an illustration of a personal computer including a main body 2001, an image input part 2002, a display part 2003, a keyboard 2004, and the like. The present invention can be applied to the image input part 2002, the display part 2003, and the other signal control circuit.

Figure 14B:
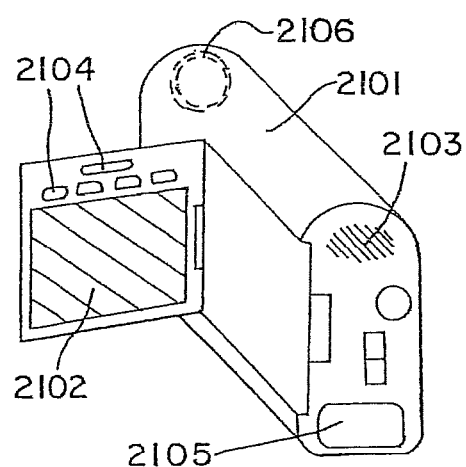

FIG. 14(B) is an illustration of a video camera including a main body 2101, a display part 2102, a voice input part 2103, an operation switch 2104, a battery 2105, an image receiving part 2106, and the like. The present invention can be applied to the display part 2102 and the other signal control circuit.

Figure 14C:
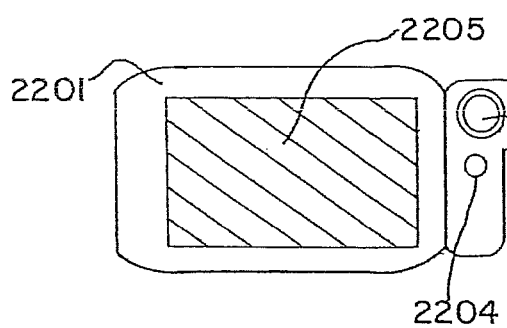

FIG. 14(C) is an illustration of a mobile video camera including a main body 2201, a camera part 2202, an image receiving part 2203, an operation switch 2204, a display part 2205, and the like. The present invention can be applied to the display part 2205 and the other signal control circuit.

Figure 14D:
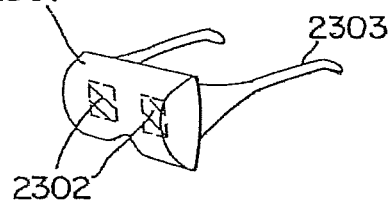

FIG. 14(D) is an illustration of a goggle type display including a main body 2301, a display part 2302, an arm part 2303, and the like. The present invention can be applied to the display part 2302 and the other signal control circuit.

Figure 14E:
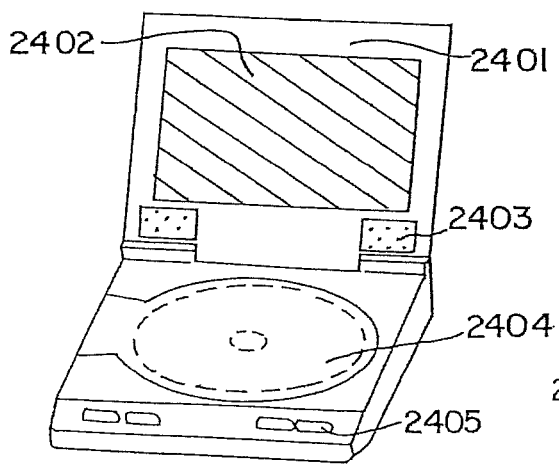

FIG. 14(E) is an illustration of a player using a recording medium for recording a program (hereinafter referred to as recording medium) including a main body 2401, a display part 2402, a speaker part 2403, a recording medium 2404, an operation switch 2405, and the like. In this connection, this player uses a DVD (digital versatile disc), a CD, and the like as the recording medium, and can be used for a music appreciation, a movie appreciation, a game, and an Internet. The present invention can be applied to the display part 2402 and the other signal control circuit.

Figure 14F:
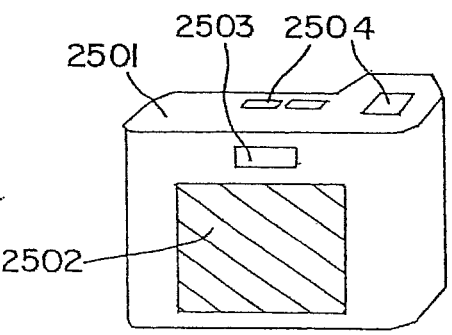

FIG. 14(F) is an illustration of a digital camera including a main body 2501, a display part 2502, an eyepiece part 2503, an operation switch 2504, an image receiving part (not shown), and the like. The present invention can be applied to the display part 2502 and the other signal control circuit.

FIG. 15(A) is an illustration of a front type projector including a projector unit 2601, a screen 2602, and the like. The present invention can be applied to a liquid display device 2808 constituting a part of the projector unit 2601 and the other signal control circuit.

FIG. 15(B) is an illustration of a rear type projector including a main body 2701, a projector unit 2702, a mirror 2703, a screen 2704, and the like. The present invention can be applied to a liquid display device 2808 constituting a part of the projector unit 2702 and the other signal control circuit.

In this connection, FIG. 15(C) is an illustration of an example of the structure of the projection units 2601 and 2702 in FIG. 15(A) and FIG. 15(B). The projection units 2601 and 2702 are constituted by a light source optical system 2801, mirrors 2802, 2804 to 2806, a dichroic mirror 2803, a prism 2807, a liquid crystal display device 2808, a phase plate 2809, and a projection optical system 2810. The projection optical system 2810 is constituted by an optical system including a projection lens. While the present embodiment shows an example of a three-lens type projector, it is not intended to limit the present invention to this type, but the present invention can be applied to a single lens type projector. Further, a person putting the present invention into practice may arrange an optical system appropriately including an optical lens, a film having a polarizing function, a film controlling a phase difference, an IR film, and the like, in an optical path designated by an arrow in FIG. 15(C).

Also, FIG. 15(D) is an illustration of an example of the structure of the light source optical system 2801 in FIG. 15(C). In the present embodiment, the light source optical system 2801 is constituted by a reflector 2811, a light source 2812, lens arrays 2813 and 2814, a polarization conversion element 2815, and a converging lens 2816. In this connection, the light source optical system 2801 shown in FIG. 15(D) is an example and it is not intended to limit the present invention to this light source optical system. For example, a person putting the present invention into practice may arrange an optical system including an optical lens, a film having a polarizing function, a film controlling a phase difference, an IR film, and the like, in the light source optical system appropriately.

However, in the projector shown in FIG. 15, there is shown a case using a transparent type electro-optical device, and there is not shown an application of a reflection type electro-optical device and an EL display device.

Figure 16A:
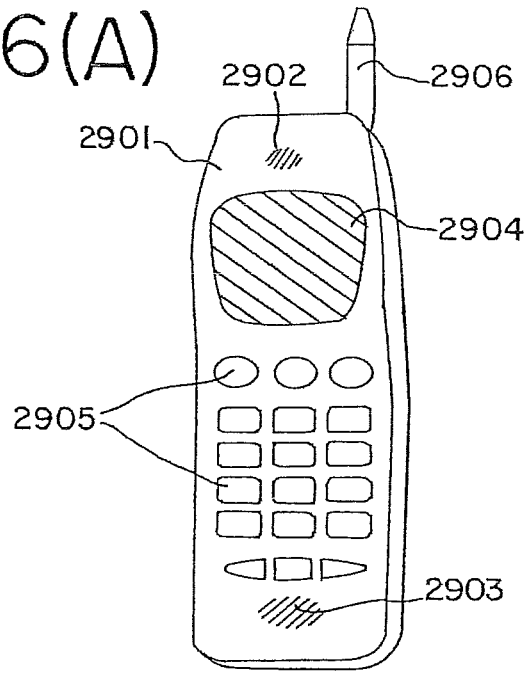

FIG. 16(A) is an illustration of a cellular phone including a main body 2901, a voice output part 2902, a voice input part 2903, a display part 2904, an operation switch 2905, and an antenna 2906, and the like. The present invention can be applied to the voice output part 2902, the voice input part 2903, the display part 2904, and the other signal control circuit.

Figure 16B:
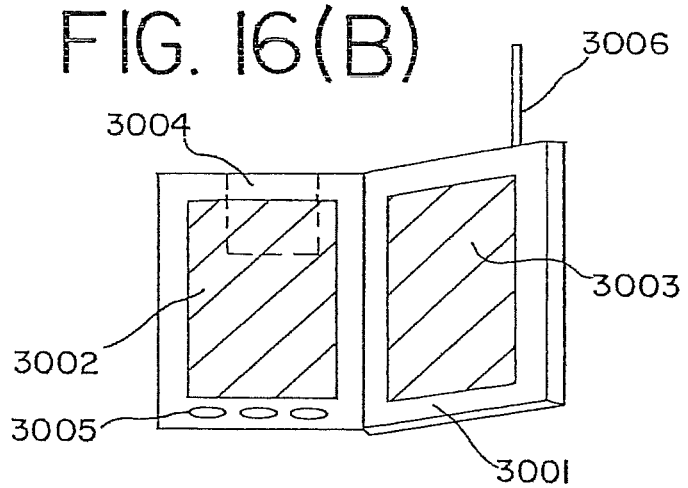

FIG. 16(B) is an illustration of a portable book (digital book) including a main body 3001, display parts 3002, 3003, a memorizing medium 3004, an operation switch 3005, and an antenna 3006, and the like. The present invention can be applied to the display parts 3002, 3003 and the other signal control circuit.

Figure 16C:
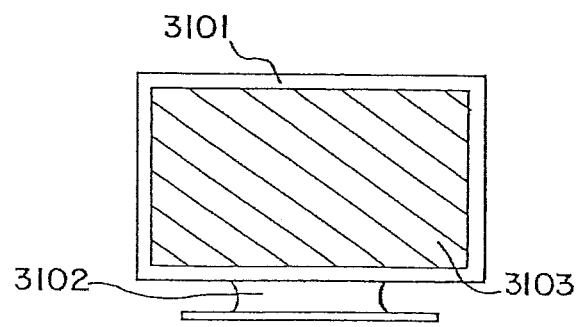

FIG. 16(C) is an illustration of a display including a main body 3101, a support base 3102, a display part 3103, and the like. The present invention can be applied to the display part 3103. The display in accordance with the present invention is advantageous in the case of a large screen, and in particular, in the case of a display having a diagonal size of 10 inches or more (in particular, 30 inches or more).

The present invention makes it possible to manufacture a TFT having excellent electrical characteristics and high reliability by controlling the ratio of composition of Si, O, N of an silicon oxide nitride film formed on the surface of a substrate. Also, the present invention can improve the reliability of a semiconductor device using the TFT like this.

What is claimed is:

1. A semiconductor device comprising:
    a first insulating layer comprising silicon, nitrogen, and oxygen over a substrate;
    a second insulating layer comprising silicon, nitrogen, and oxygen over the first insulating layer;
    a polycrystalline semiconductor film over the second insulating layer, the polycrystalline semiconductor film including a channel forming region;
    a planarization layer over the polycrystalline semiconductor film, and
    a pixel electrode over the planarization layer, wherein the pixel electrode is electrically in contact with the polycrystalline semiconductor film,
    wherein a concentration ratio of nitrogen to silicon of the first insulating layer ranges from 0.3 to 1.6, and
    wherein a concentration of nitrogen of the first insulating layer is higher than a concentration of nitrogen of the second insulating layer.

2. The semiconductor device according to claim 1, wherein a concentration ratio of oxygen to silicon of the first insulating layer ranges from 0.1 to 1.7.

3. The semiconductor device according to claim 1, wherein the concentration of nitrogen of the first insulating layer is higher than $2 \times 10^{20}$ atoms/cm$^3$.

4. The semiconductor device according to claim 1, wherein the substrate is a glass substrate.

5. The semiconductor device according to claim 1, wherein the planarization layer includes a resin material.

6. The semiconductor device according to claim 1, wherein the semiconductor device is incorporated into an electronic device selected from the group consisting of a personal computer, a video camera, a goggle type display, a player using a recording medium, a digital camera, a projector, a cellular phone, a digital book and a display.

7. The semiconductor device according to claim 1, further comprising a liquid crystal layer interposed between the substrate and a second substrate.

8. The semiconductor device according to claim 1, further comprising a light-emitting layer over the pixel electrode.

9. A semiconductor device comprising:
an insulating layer comprising silicon, nitrogen, and oxygen over a substrate;
a polycrystalline semiconductor film over the insulating layer, wherein the polycrystalline semiconductor film includes a channel forming region;
a planarization layer over the polycrystalline semiconductor film, and
a pixel electrode over the planarization layer, wherein the pixel electrode is electrically in contact with the polycrystalline semiconductor film,
wherein a concentration ratio of oxygen to silicon of the insulating layer ranges from 0.1 to 1.7, and
wherein a concentration ratio of nitrogen to silicon of the insulating layer ranges from 0.3 to 1.6.

10. The semiconductor device according to claim 9, wherein a concentration of nitrogen of the insulating layer is higher than $2 \times 10^{20}$ atoms/cm$^3$.

11. The semiconductor device according to claim 9, wherein the substrate is a glass substrate.

12. The semiconductor device according to claim 9, wherein the planarization layer includes a resin material.

13. The semiconductor device according to claim 9, wherein the semiconductor device is incorporated into an electronic device selected from the group consisting of a personal computer, a video camera, a goggle type display, a player using a recording medium, a digital camera, a projector, a cellular phone, a digital book and a display.

14. The semiconductor device according to claim 9, further comprising a liquid crystal layer interposed between the substrate and a second substrate.

15. The semiconductor device according to claim 9, further comprising a light-emitting layer over the pixel electrode.

16. The semiconductor device according to claim 9, further comprising:
a second insulating layer comprising silicon, nitrogen, and oxygen over the insulating layer; and
a third insulating layer comprising silicon and oxygen over the second insulating layer,
wherein the polycrystalline semiconductor film is provided over the third insulating layer.

17. A semiconductor device comprising:
an insulating layer comprising silicon, nitrogen, and oxygen over a substrate;
a polycrystalline semiconductor film formed over and in contact with the insulating layer, wherein the polycrystalline semiconductor film includes a channel forming region;
a gate insulating layer over the polycrystalline semiconductor film;
a gate electrode over the channel forming region with the gate insulating layer therebetween;
a planarization layer over the gate electrode, and
a pixel electrode over the planarization layer, wherein the pixel electrode is electrically in contact with the polycrystalline semiconductor film,
wherein a concentration ratio of nitrogen to silicon of the insulating layer ranges from 0.3 to 1.6.

18. The semiconductor device according to claim 17, wherein a concentration ratio of oxygen to silicon of the insulating layer ranges from 0.1 to 1.7.

19. The semiconductor device according to claim 17, wherein a concentration of nitrogen of the insulating layer is higher than $2 \times 10^{20}$ atoms/cm$^3$.

20. The semiconductor device according to claim 17, wherein the substrate is a glass substrate.

21. The semiconductor device according to claim 17, wherein the planarization layer includes a resin material.

22. The semiconductor device according to claim 17, wherein the semiconductor device is incorporated into an electronic device selected from the group consisting of a personal computer, a video camera, a goggle type display, a player using a recording medium, a digital camera, a projector, a cellular phone, a digital book and a display.

23. The semiconductor device according to claim 17, further comprising a liquid crystal layer interposed between the substrate and a second substrate.

24. The semiconductor device according to claim 17, further comprising a light-emitting layer over the pixel electrode.

* * * * *